(12) United States Patent
Takei et al.

(10) Patent No.: US 8,288,184 B2
(45) Date of Patent: Oct. 16, 2012

(54) PRODUCTION METHOD OF SEMICONDUCTOR DEVICE AND SEMICONDUCTOR DEVICE

(75) Inventors: Michiko Takei, Osaka (JP); Yutaka Takafuji, Osaka (JP); Yasumori Fukushima, Osaka (JP); Kazuhide Tomiyasu, Osaka (JP); Steven Roy Droes, Camas, WA (US)

(73) Assignee: Sharp Kabushiki Kaisha, Osaka (JP)

( * ) Notice: Subject to any disclaimer, the term of this patent is extended or adjusted under 35 U.S.C. 154(b) by 215 days.

(21) Appl. No.: 12/741,852

(22) PCT Filed: Oct. 14, 2008

(86) PCT No.: PCT/JP2008/068596
§ 371 (c)(1),
(2), (4) Date: May 7, 2010

(87) PCT Pub. No.: WO2009/078215
PCT Pub. Date: Jun. 25, 2009

(65) Prior Publication Data
US 2010/0270618 A1    Oct. 28, 2010

(30) Foreign Application Priority Data

Dec. 18, 2007 (JP) .................................. 2007-326420

(51) Int. Cl.
*H01L 21/00* (2006.01)

(52) U.S. Cl. .......... 438/30; 438/197; 438/149; 438/347; 257/E21.051; 257/E21.082; 257/E21.17; 257/E21.32; 257/E21.229; 257/E21.304; 257/E21.246; 257/E21.267; 257/E21.324

(58) Field of Classification Search ............... 438/30, 438/106, 197, 149, 347, 680, 692, 712, 786, 438/787, 475, 477, 478; 257/E21.051, E21.082, 257/E21.17, E21.32, E21.229, E21.304, E21.246, 257/E21.267, E21.324
See application file for complete search history.

(56) References Cited

U.S. PATENT DOCUMENTS

| | | | | |
|---|---|---|---|---|
| 5,807,783 | A | * | 9/1998 | Gaul et al. .................. 438/406 |
| 5,854,123 | A | * | 12/1998 | Sato et al. .................. 438/507 |
| 5,952,694 | A | * | 9/1999 | Miyawaki et al. ............ 257/347 |
| 6,191,007 | B1 | | 2/2001 | Matsui et al. |
| 2004/0266209 | A1 | | 12/2004 | Hinode et al. |
| 2006/0043485 | A1 | | 3/2006 | Fukushima et al. |
| 2008/0318390 | A1 | | 12/2008 | Fukushima et al. |

FOREIGN PATENT DOCUMENTS

JP       8-288295 A    11/1996
(Continued)

*Primary Examiner* — David Nhu
(74) *Attorney, Agent, or Firm* — Birch, Stewart, Kolasch & Birch, LLP

(57) ABSTRACT

A production method for producing a semiconductor device capable of improving surface flatness and suppressing a variation in electrical characteristics of the semiconductor chip, and improving production yield. The production method includes the steps of: forming a first insulating film on a semiconductor substrate and on a conductive pattern film formed on the semiconductor substrate and reducing a thickness of the first insulating film in a region where the conductive pattern film is arranged by patterning; forming a second insulating film and polishing the second insulating film, thereby forming a flattening film; implanting a substance for cleavage into the semiconductor substrate through the flattening film, thereby forming a cleavage layer; transferring the semiconductor chip onto a substrate with an insulating surface so that the chip surface on the side opposite to the semiconductor substrate is attached thereto; and separating the semiconductor substrate from the cleavage layer.

16 Claims, 10 Drawing Sheets

FOREIGN PATENT DOCUMENTS

| | | |
|---|---|---|
| JP | 11-186186 A | 7/1999 |
| JP | 2000-340567 A | 12/2000 |
| JP | 2003-163194 A | 6/2003 |
| JP | 2005-39244 A | 2/2005 |
| JP | 2006-66591 A | 3/2006 |
| JP | 2006-294703 A | 10/2006 |

* cited by examiner

PRODUCTION METHOD OF SEMICONDUCTOR DEVICE AND SEMICONDUCTOR DEVICE

This application is a national stage application of PCT International Application No. PCT/JP2008/068596, filed on Oct. 14, 2008 under 35 U.S.C. §371, which claims priority under 35 U.S.C. §119 on Japanese Application No. 2007-326420, filed on Dec. 18, 2007, the contents of each of which are incorporated by reference in their entirety.

TECHNICAL FIELD

The present invention relates to a production method of a semiconductor device and a semiconductor device. More particularly, the present invention relates to a production method of a semiconductor device and a semiconductor device, each suitably used in display devices.

BACKGROUND ART

Semiconductor devices are electronic devices including semiconductor elements and the like exploiting electric properties of semiconductor materials. Such semiconductor devices have been widely used in audio equipment, communication equipment, computers, electric appliances, and the like. Particularly, semiconductor devices including a circuit element having a MOS (metal oxide semiconductor) structure, a TFT (thin film transistor), and the like, allows display devices such as a LCD to provide high-resolution image display and high-speed moving image display.

For such system LCDs, a reduction in electric power consumption and higher-resolution and higher-speed image display are needed. Along with this, downsize of a peripheral driving circuit of such system LCDs is also needed. Specifically, peripheral driving circuits with sub-micron design rules, i.e., circuits on which wirings are finely patterned like ICs, are needed. Further, also in order to increase carrier mobility in a semiconductor layer, the semiconductor elements also need to be finely patterned.

However, it is difficult to form such high-performance semiconductor elements of submicron order directly on a glass or quartz substrate, which is typically used in display devices such as a LCD device. For example, Patent Document 1 discloses a method of arranging a TFT on a glass substrate, by initially forming a TFT on a semiconductor substrate, and transferring the TFT onto a glass substrate by separating it from the semiconductor substrate. This method allows a highly-integrated and high performance semiconductor device including a single crystal silicon functional layer to be formed on a glass substrate and the like.

With regard to methods of producing semiconductor substrates such as a SOI (silicon on insulator) substrate, for example, Patent Document 2 discloses, as a method of forming an ion implantation layer in a semiconductor substrate having a pattern structure formed thereon, a method of forming an ion implantation-adjusting layer on the pattern structure surface, thereby forming an ion implantation layer at a uniform depth.
[Patent Document 1]
Japanese Kokai Publication No. 2006-294703
[Patent Document 2]
Japanese Kokai Publication No. Hei-11-186186

DISCLOSURE OF INVENTION

According to the method disclosed in Patent Document 1, prior to the transfer of the transistor from the semiconductor substrate to the glass substrate, a gate electrode and a dummy pattern not overlapping therewith are formed on the glass substrate, and an insulating film is formed thereon. The formed insulating film surface gently slopes and thereon, a flattening film is formed. Then, the surface of this flattening film is flattened by CMP (chemical mechanical polishing) and the like. However, since the insulating film, which resides below the flattening film, has a gently sloping surface, the chem-mech polished flattening film has big wave-like dishing on its surface, possibly leading to deterioration of surface flatness thereof. Further, through the insulating film having a gently sloping surface, ions are implanted into the semiconductor substrate, thereby forming a cleavage layer therein. As a result, the cleavage layer is not formed at a uniform depth, and the transferred functional layer (a semiconductor layer having source, channel, and drain regions) of the transistor has a thickness varying in the semiconductor element. The uneven thickness of the functional layer of the transistor greatly affects electric properties of the TFT, such as parasitic capacitance, threshold potential, and subthreshold characteristics. In this point, the method of Patent Document 1 has room for improvement.

According to Patent Document 2, the ion implantation-adjusting layer is formed by forming a polysilicon film, which is a material for the layer, on the pattern structure and then polishing it. In this case, the polysilicon film has concave and convex portions derived from the shape of the pattern structure and this polysilicon film is polished without performing any treatment for the film before the polishing, and so the resulting ion implantation-adjusting layer possibly has dishing and the like despite the polishing, failing to show insufficient flatness. The substrate produced by the method disclosed in Patent Document 2 is a SOI substrate, and so the substrate before being attached to another substrate includes no gate electrode and the like constituting a TFT.

The CMP for the insulating film is mentioned with reference to the following example shown in FIG. 13-1. A gate insulating film 2 is formed on a semiconductor substrate 1 and thereon, a narrow gate electrode 3a, which has a small linewidth, and a wide gate electrode 3b, which has a large linewidth, are formed. Thereon an interlayer insulating film is formed, and then its surface is flattened by CMP. As a result, as shown in FIG. 13-2, the polished interlayer insulating film 4 has convex portions 5a and 5b derived from the narrow gate electrode 3a and the wide gate electrode 3b respectively. Then, as shown in FIG. 13-3, the interlayer insulating film 4 surface is polished to be flattened by applying a pressure thereto by a polishing pad 7 through a slurry (polishing agent) therebetween. The pressure is applied in directions shown in the arrows in FIG. 13-3.

The CMP rate increases with an increase in pressure applied by the polishing pad 7. A polishing pressure larger than that for a flat portion 110 between the convex portions 5a and 5b is applied to corners 6a and 6b of the convex portions 5a and 5b. As a result, the corners 6a and 6b are quickly polished and flattened.

In FIG. 13-4, the dotted lines show surface shapes 8a, 8b, and 8c of the interlayer insulating film when the film surface is flattened by CMP. The surface shape 8a of the film 4 changes into a surface shape of an interlayer insulating film 4b, through shapes shown in 8b and 8c. As shown in FIG. 13-4, the film 4 surface is polished until a difference in height from the gate insulating film 2 surface to the film 4b surface is eliminated between a region where the narrow gate electrode 3a is arranged and a region where neither narrow gate electrode 3a nor wide gate electrode 3b are arranged.

However, the difference in the height between the region where the wide gate electrode 3b is arranged and the region where neither narrow gate electrode 3a nor wide gate electrode 3b are arranged is difficult to be eliminated, so the film 4b in a portion derived from a side edge of the convex portion 5b has a gently sloping surface. So the height (h1) from the gate insulating film 2 surface to the interlayer insulating film 4b surface in the wide gate electrode 3b region is larger than the height (h2) in the narrow gate electrode 3a region, and the film 4b tends to have an uneven surface (surface through which hydrogen ions are implanted into the substrate). The height h1 in the electrode 3b region is larger than the height h2 in the electrode 3a region apart from the electrode 3b region by the thickness of the electrode 3b.

As shown in FIG. 13-5, by implanting hydrogen ions into the substrate through the uneven surface of the film 4b, a cleavage layer 9, which is formed in the semiconductor substrate by the ion implantation, has a thickness uneven due to the uneven surface of the interlayer insulating film 4b, the thickness being a depth from the cleavage layer 9 surface to an interface between the semiconductor substrate and the gate insulating film. When such a depth is uneven, a semiconductor portion, which is cleaved portion from the semiconductor substrate, has a region with an uneven thickness. If such a semiconductor portion is used as a functional layer of a TFT, the uneven thickness of the semiconductor portion possibly causes a variation in electric properties among the TFTs.

The present invention has been made in view of the above-mentioned state of the art. The present invention has an object to provide a production method of a semiconductor device, capable of: improving surface flatness of a semiconductor chip formed on a semiconductor substrate and thereby uniforming a depth from the flattening film surface to the cleavage layer surface to suppress a variation in electric properties of the semiconductor chip having been transferred onto a substrate with an insulating surface; and increasing a success probability of the separation, thereby improving the production yield.

The present inventors made various investigations on methods of suppressing a variation in electric properties of among TFTs of a semiconductor chip having been transferred from a semiconductor substrate to a substrate with an insulating surface, such as a glass substrate. Then, the inventors noted flattening for the semiconductor chip surface and found the followings. If a surface of a semiconductor structure (a structure formed on a donor substrate before being divided into a chip) is flattened by a CMP process, and the like, an insulating film formed on closely-spaced conductive pattern films included in the semiconductor structure can be flattened because a different in height of the insulating film surface between a region where the conductive pattern film is arranged and a region where the conductive pattern film is not arranged can be almost eliminated. This is because a polishing rate for convex portions of the insulating film, derived from the conductive pattern surface shape, is relatively high. In a region where the conductive pattern films are widely spaced, however, the insulating film formed on the films has uneven and gently sloping surface, i.e., big wave-like dishing. The inventors further found that a flattening film with high surface flatness can be formed by a method including the successive steps of: forming a first insulating film on a conductive pattern film formed on a semiconductor substrate and patterning the first insulating film, thereby forming a first insulating pattern film at least in a region where the conductive pattern film is not arranged (a first insulating pattern film-forming step); forming a second insulating film and polishing the second insulating film, thereby forming a flattening film (a flattening film-forming step); implanting a substance for cleavage into the semiconductor substrate through the flattening film, thereby forming a cleavage layer (a cleavage layer-forming step); attaching the flattening film of the semiconductor substrate to the substrate with an insulating surface, thereby completing attachment between the two substrates (an attachment step); and separating the semiconductor substrate from the cleavage layer (a separation step). According to this method, the shape of the second insulating film can be controlled and a polishing rate difference attributed to the controlled shape, and thereby the flattening film with high surface flatness can be formed. The present inventors also found the followings. The cleavage layer, which is formed by implanting the substance for cleavage into the semiconductor substrate, can be formed at a uniform depth by the above-mentioned steps, and the semiconductor portion of the semiconductor chip having been separated from the semiconductor substrate can be uniform in thickness, and so the variation in electric properties of the semiconductor chip can be suppressed. According to these findings, for example, if the semiconductor chip includes TFTs, for example, the depth from the semiconductor chip surface to the interface between the functional layer and the gate insulating film can be uniform, and the thickness of the functional layer of the chip having been separated from the semiconductor substrate can be uniform. So the TFTs and the like included in the semiconductor chip can show more uniform electric properties. As a result, a success probability of separation of the semiconductor chip from the substrate with an insulating surface can be increased, resulting in an improvement in production yield. As a result, the present inventors admirably solved the above-mentioned problems, leading to completion of the present invention.

The present invention is a production method of a semiconductor device including a semiconductor chip on a substrate with an insulating surface, the semiconductor chip having a conductive pattern film, the production method comprising the following successive steps:

a first insulating pattern film-forming step of forming a first insulating film on a semiconductor substrate and on a conductive pattern film formed on the semiconductor substrate and reducing a thickness of the first insulating film in a region where the conductive pattern film is arranged by patterning;

a flattening film-forming step of forming a second insulating film and polishing the second insulating film, thereby forming a flattening film;

a cleavage layer-forming step of implanting a substance for cleavage into the semiconductor substrate through the flattening film, thereby forming a cleavage layer;

an attachment step of attaching the flattening film of the semiconductor substrate to a substrate with an insulating surface, thereby completing attachment between the two substrates; and a separation step of separating the semiconductor substrate from the cleavage layer.

Further, the present invention is also a semiconductor device produced by this production method.

The present invention is mentioned below in detail.

According to the production method of the semiconductor device of the present invention, a semiconductor device including a semiconductor chip having a conductive pattern film on a substrate with an insulating surface is produced. The above-mentioned semiconductor chip includes at least a conductive pattern film and is preferably used as a switching element such as a TFT or a component thereof, or as an assembly of such switching elements or a component thereof.

The assembly of the switching elements includes, for example, wirings for connecting the switching elements to each other. If the semiconductor device is used in a display device such as a LCD device, the semiconductor chip may be, for example, a storage capacitor element for storing a voltage applied to LCs when pixels constituting a display image are in an on-state. The conductive pattern film is formed not over the entire surface of the semiconductor chip but partially formed thereon. The conductive pattern film is not especially limited as long as it is made of a conductive material. It may be made of a metal material, a semiconductor material, for example. Specific examples of the conductive pattern film include a gate electrode of a TFT, a gate wiring, a source wiring, and a drain wiring. The substrate with an insulating surface (hereinafter, also referred to as an acceptor substrate) may be an insulating substrate such as a glass substrate and a plastic substrate. A substrate with conductivity may be used as long as a surface thereof has an insulating property. For example, an insulating layer may be formed on the substrate surface. In addition, the insulating substrate may include an insulating layer formed thereon.

The production method includes the first insulating pattern film-forming step. In this step, the first insulating film is formed on the semiconductor substrate and on the conductive pattern film formed on the semiconductor substrate, and the thickness of the first insulating film in a region where the conductive pattern film is arranged is reduced by patterning to form a first insulating pattern film. Specifically, a remaining portion of the first insulating film after the patterning corresponds to the first insulating pattern film. As a result of this step, the shape of the below-mentioned second insulating film, which is formed on the first insulating pattern film, can be controlled, and so the surface flatness of the flattening film formed by polishing the second insulating film can be improved. When an insulating film formed on conductive pattern films is polished by CMP and the like to give a flattening film, the flattening film might have a gently sloping surface due to an uneven surface defined by the conductive pattern films. In such a case, the polished insulating film, i.e., the flattening film might have dishing and the like and fails to have high surface flatness. According to the production method of the semiconductor device of the present invention, at least a deep concave portion defined by the conductive pattern films (for example, a concave portion defined by side surfaces of the conductive pattern films and a surface of a layer widely formed on and below the conductive pattern films) can be filled with the first insulating pattern film. So a difference in height between the region where the conductive pattern film is arranged and the region where the conductive pattern film is not arranged can be compensated. Thus, the height after completion of formation of the first insulating pattern film can be uniformed. Thus, by patterning the first insulating film, specifically, forming the first insulating pattern film, the flatness of the below-mentioned flattening film can improved. The "region" used herein is intended to refer to the entire target range when the principle surface of the semiconductor substrate is viewed in plane and also refer to such a range not only in plane but in depth. For example, the "region where the conductive pattern film is arranged" means the entire region where the conductive pattern film is positioned when the principal surface of the semiconductor substrate is viewed in plane. In the present description, the "region where the conductive pattern film is not arranged" means a region other than the region where the conductive pattern film is arranged.

The first insulating pattern film is formed by patterning the first insulating film. The first insulating pattern film is not especially limited and may be arranged on the conductive pattern film as long as it is arranged in at least a portion of the region where the conductive pattern film is not arranged. Specifically, in the first insulating pattern film-forming step, the entire first insulating film on the conductive pattern film may not be necessarily removed. The first insulating pattern film may be also polished after the patterning. Specifically, the production method may include a step of polishing the patterned first insulating film surface. In such a case, the polished first insulating film corresponds to the first insulating pattern film. The polishing is performed after the patterning, thereby more improving the surface flatness of the below-mentioned flattening film, which is to be formed on the first insulating pattern film. It is preferable that the difference in thickness between the first insulating pattern film in the region where the conductive pattern film is arranged and the first insulating pattern film in the region where the conductive pattern film is not arranged is 1% or smaller. This allows a further improvement in flatness of the below-mentioned polished second insulating film.

The method of forming the first insulating film is not especially limited. Sputtering, CVD (chemical vapor deposition), and the like, may be employed, and PECVD (plasma enhanced CVD) is particularly preferably employed. A silicon oxide material and the like may be used for the first insulating film and the first insulating pattern film. A $SiO_2$ material formed by PECVD using TEOS as a raw material is particularly preferably used. The "height" used herein is intended to refer to a height from a point on a plane to another point. The "depth" used herein means a depth from a point on a plane to another point.

The above-mentioned semiconductor substrate includes components of the semiconductor chip, formed thereon, and the chip is transferred onto another substrate from the semiconductor substrate. Examples of such a substrate include semiconductor substrates such as a single crystal silicon substrate and germanium substrate, and compound semiconductor substrates.

The production method includes the flattening film-forming step. In this step, the second insulating film is formed and then polished to give the flattening film. The second insulating film on the first insulating pattern film has a surface shape derived from the shape of the first insulating pattern film surface. So the polished second insulating film, i.e., the flattening film can show high surface flatness. The second insulating film may be a single film or a multi-layer film composed of two or more layers.

It is preferable that the second insulating film is directly on the first insulating pattern film. Specifically, it is preferable that the first insulating pattern film is in contact with the second insulating film. According to this, the second insulating film can be provided with a shape more closely corresponding to the shape of the first insulating pattern film, and as a result, the surface flatness of the flattening film can be improved.

The above-mentioned production method includes the cleavage layer-forming step. In this step, a substance for cleavage is implanted into the semiconductor substrate through the flattening film, thereby forming the cleavage layer. As a result of this, the flattening film has high surface flatness compared with the case where no first insulating pattern film is formed. So a depth to which the substance for cleavage reaches can be uniformed, which allows the cleavage layer to be formed at a uniform depth in the semiconductor substrate. According to this, the variation in thickness of the semiconductor portion (a separated portion from the semiconductor substrate) of the semiconductor chip can be suppressed. The cleavage layer for separating the semiconductor substrate from the acceptor substrate is formed by implantation of the substance for cleavage, and this cleavage layer permits easy completion of the transfer the semiconductor chip onto the acceptor substrate.

The production method includes the attachment step and the separation step. In the attachment step, the flattening film of the semiconductor substrate is attached to the substrate with an insulating surface, thereby completing attachment between the two substrates. In the separation step, the semiconductor substrate is separated along the cleavage layer. Preferably, the semiconductor substrate including the conductive pattern film, the first insulating pattern film, and the flattening film, is attached to the acceptor substrate surface with the flattening film therebetween, and then the cleavage layer is severed to separate the semiconductor substrate from the acceptor substrate, thereby completing transfer of the semiconductor chip onto the acceptor substrate. According to this, the semiconductor portion of the separated semiconductor chip can be uniformed in thickness and so the variation of electric properties of the semiconductor chip can be suppressed. If the semiconductor chip includes TFTs, for example, a depth to which the substance for cleavage reaches can be uniformed, and so the depth from the cleavage layer to the flattening film surface also can be uniformed. As a result, the functional layer of the TFTs of the separated semiconductor chip has a uniform thickness and uniformity of the electric properties among the TFTs and the like can be more improved. When the semiconductor portion of the separated semiconductor chip has an uneven thickness and the uneven thickness is adjusted by etching, the portion still has an uneven thickness. On the other hand, when the separated semiconductor portion has a uniform thickness, the thickness of the functional layer can be uniformed also in the case where the thickness of the semiconductor portion is adjusted after the separation. Further, uniformity of operation properties of high performance semiconductor elements (for example, TFTs) of sub-micron order formed on a substrate with an insulating surface, such as a glass substrate and a quartz substrate, can be improved. In addition, the cleavage layer is formed at a uniform depth, and so the success probability of the separation can be increased, which leads to an improvement in production yield. Also if an insulating film is further formed on the flattening film, the surface of the insulating film can be easily flattened attributed to the flattening film. In the attachment step, it is preferable that a surface of the semiconductor substrate, on the side where the conductive pattern is formed, and at least one surface of the acceptor substrate are subjected to an activation treatment such as SC1 or plasma treatment, and then the two surfaces are attached to each other. It is preferable that the separation step is performed by heat treatment or application of stress such as shearing stress. When the semiconductor chip includes TFTs, for example, it is preferable that the production method further includes, before the transfer and after the cleavage layer-forming step, a step of forming electrodes such as a source electrode and a drain electrode, and a step of forming an insulating film on the electrodes and flattening the insulating film.

Preferable embodiments of the production method of the semiconductor device of the present invention are mentioned in more detail below.

In the first insulating pattern film-forming step, it is preferable that in the first insulating pattern film-forming step, the patterning is performed so that the first insulating pattern film in the region where the conductive pattern film is arranged has a thickness smaller than a thickness of the first insulating pattern film in a region where the conductive pattern film is not arranged. According to this, the height of a convex portion of the first insulating film, which is derived from the thickness of the conductive pattern film, can be decreased, or the convex portion can be eliminated. So the flatness of the flattened second insulating film, i.e., the flattening film can be more improved. Further, the first insulating pattern film is arranged on the conductive pattern film, which can prevent etching of a film arranged just below the first insulating pattern film. If the film arranged just below the first insulating pattern film is the conductive pattern film, it is possible to prevent conductivity and the like of the conductive pattern film from changing by etching. It is preferable that the patterning is performed so that the thickness of the first insulating pattern film in the region where the conductive pattern film is arranged accounts for 10% or smaller relative to that in the region where the conductive pattern film is not arranged. According to this, the flatness of the flattening film can be more improved.

In the first insulating pattern film-forming step, it is preferable that etching for the first insulating film in the region where the conductive pattern film is not arranged is performed to form the first insulating pattern film both in the region where the conductive pattern film is arranged and in the region where the conductive pattern film is not arranged. For example, if the first insulating pattern film is formed by just-etching or over-etching, the surface of the conductive pattern film might be etched, possibly resulting in a change of its conductivity and the like. As a result, the performances of the semiconductor chip might be varied. So the first insulating pattern film is arranged also on the conductive pattern film, thereby preventing the conductive pattern film surface from being etched. As a result, the semiconductor chip including the conductive pattern films conductivity and the like of which is not changed can be provided.

It is preferable that the patterning is performed so that the first insulating pattern film is formed only in the region where the conductive pattern film is not arranged. According to this, the concave portion defined by the conductive pattern films is filled with the first insulating pattern film to flatten the surface defined by the conductive pattern films and the first insulating pattern film. So influences from the concave and convex portions of the films arranged below the second insulating film can be suppressed when the second insulating film formed on the first insulating pattern film is polished.

It is preferable that the patterning is performed so that the first insulating pattern film in the region where the conductive pattern film is not arranged is positioned 3 μm or smaller away from an edge of the conductive pattern film in an outside direction of the conductive pattern film. Specifically, it is preferable that a distance between the region where the first insulating pattern film is arranged and the region where the conductive pattern film is arranged is 3 μm or smaller. Even if the first insulating pattern film has a portion overlapping with the conductive pattern film, it is preferable that a distance between an edge of the conductive pattern film and an edge of a portion not overlapping with the conductive pattern film of the first insulating pattern film is 3 μm or smaller. According to this, a wide concave portion defined by conductive pattern films can be made smaller by the first insulating pattern film, and so the second insulating film, which is formed on the conductive pattern films and the first insulating pattern film, becomes less likely have a wide concave portion. As a result, the surface flatness of the polished second insulating film, i.e., the flattening film, can be more improved. It is sufficient that at least a portion of the first insulating pattern film is positioned 3 μm or smaller away from the edge of the conductive pattern film in the outside direction of the conductive pattern film. The first insulating pattern film may have a portion overlapping with the conductive pattern film. In such a case, it is preferable that the overlapping portion is positioned 3 μm or smaller away from the conductive pattern film in the inside direction of the conductive pattern film.

It is preferable that a wide pattern film and a narrow pattern film are arranged as the conductive pattern film, and in the first insulating pattern film-forming step, the patterning is performed so that a thickness of the first insulating film in a region where the wide pattern film is arranged is reduced. According to this, the surface flatness of the flattening film can be more improved. If the first insulating film is formed on the wide pattern film, the first insulating film has a convex portion having a width larger than a width of the wide pattern film, and the width varies depending on the width of the wide pattern film. So the convex portion of the first insulating film is subjected to the patterning, which can at least partly decrease the height of the wide convex portion of the first insulating film. As a result, the surface flatness of the polished second insulating film, i.e., the flattening film, can be more improved. The wide pattern film is a conductive pattern film with a line-width larger than that of the narrow pattern film. Preferably, the wide pattern film has a line-width of 100 μm or larger. Also it is preferable that the narrow pattern film has a line-width of smaller than 100 μm. The wide and narrow pattern films are formed by the same or different steps, preferably formed by the same step and made of the same material in view of reduction in the number of production steps.

It is preferable that in the first insulating pattern film-forming step, the patterning is performed so that the first insulating film in a vicinity of an edge of the wide pattern film is provided with a convex portion projecting from a conductive pattern film side to a flattening film side when a wide pattern film and a narrow pattern film are arranged as the conductive pattern film, and in the first insulating pattern film-forming step, the patterning is performed so that a thickness of the first insulating film in a region where the wide pattern film is arranged is reduced. It is more preferable that in the first insulating pattern film-forming step, the first insulating pattern film is provided with the convex portion so that the convex portion has an edge positioned 3 μm or smaller away from an edge of the wide pattern film in the inside direction of the wide pattern film. According to this, even if mispatterning of the below-mentioned second insulating film occurs, this is generated just in the region where the wide pattern film is arranged, and the surface flatness of the flattening film is not so influenced. The convex portion formed in the vicinity of the edge of the conductive pattern film has a width smaller than the convex portion of the first insulating film on the wide pattern film. So the second insulating film, which is formed later, also has a convex portion with a small width. This allows an improvement in flatness of the patterned second insulating film, i.e., the flattening film. If, for example, mispatterning occurs when the first insulating film should be patterned just along the edge of the wide pattern film, the height of the second insulating film is largely different between the wide pattern film region and the peripheral region thereof. So a difference in thickness of the second insulating film becomes large, possibly resulting in deterioration of flatness. The first insulating film in the region where the wide pattern film is arranged is patterned so that the resulting portion has an edge positioned 3 μm or larger away from an edge of the wide pattern film in the inside direction of the wide pattern film, and thereby a convex portion is provided for the first insulating pattern film on the edge of the wide pattern film, and the convex portion has a small width and a polishing rate for the convex portion is higher than that for the large-width concave and convex portions. So it can suppress the flattening film from having dishing and the like, and the surface flatness of the flattening film can be improved with not so high alignment accuracy.

It is preferable that the flattening film-forming step includes a second insulating pattern film-forming step of patterning the second insulating film prior to the polishing. By this second insulating pattern film-forming step, the second insulating film can be formed into such a shape as to further improve the surface flatness of the flattening film formed on the conductive pattern film. If, for example, the second insulating film has a convex portion derived from the conductive pattern film, at least a part of the convex portion is subjected to patterning, thereby improving the flatness of the second insulating film. As a result, the height from the cleavage layer, which is formed by the implantation of the substance for cleavage, to the flattening film surface (the surface on the side opposite to the semiconductor substrate side) can be uniformed, and thereby the thickness of the semiconductor portion, which is to be separated from the semiconductor substrate, can be uniform. Thus, the variation in electric properties of the semiconductor chip can be suppressed. For example, if the semiconductor chip has a TFT, a variation in thickness of a functional layer can be suppressed, and the TFT can show uniform electric characteristics.

It is preferable that a wide pattern film and a narrow pattern film are formed as the conductive pattern film, and in the second insulating pattern film-forming step, the patterning is performed so that a thickness of the second insulating film in a region where the wide pattern film is arranged is reduced. According to this, the surface flatness of the flattening film can be more improved. If the first insulating film is formed on the wide pattern film, the first insulating film has a convex portion having a width larger than a width of the wide pattern film, and the width varying depending on the width of the wide pattern film. Further, the second insulating film formed on the first insulating film also has a convex portion with a shape derived from that of the convex portion of the first insulating pattern film. So the convex portion of the second insulating film is subjected to patterning, thereby improving the surface flatness of the flattening film, which is formed by patterning and then polishing the second insulating film. The wide pattern film is a conductive pattern film with a line-width larger than that of the narrow pattern film. Preferably, the wide pattern film has a line-width of 100 μm or larger. Also it is preferable that the narrow pattern film has a line-width of smaller than 100 μm. The wide and narrow pattern films may be formed by the same or different steps, preferably formed by the same step and made of the same material in view of reduction in the number of production steps.

It is preferable that in the second insulating pattern film-forming step, the second insulating film in a vicinity of an edge of the wide pattern film is provided with a convex portion projecting from a conductive pattern film side to a flattening film side when a wide pattern film and a narrow pattern film are formed as the conductive pattern film, and in the second insulating pattern film-forming step, the patterning is performed so that a thickness of the second insulating film in a region where the wide pattern film is arranged is reduced. It is more preferable that by patterning the second insulating film, the second insulating pattern film is provided with the convex portion so that the convex portion has an edge positioned 3 μm or smaller away from an edge of the wide pattern film in the inside direction of the wide pattern film. According to this, even if mispatterning of the second insulating film occurs, this is generated just in the region where the wide pattern film is arranged, and the surface flatness of the flattening film is not so influenced. If, for example, mis-patterning occurs when the second insulating film should be patterned just along the edge of the wide pattern film, the height of the second insulating film is largely different between the wide pattern film region and the peripheral region thereof. So a difference in thickness of the second insulating film becomes large, possibly resulting in deterioration of flatness. The second insulating film in the region where the wide pattern film is arranged is patterned so that the resulting portion has an edge positioned 3 µm or larger away from an edge of the wide pattern film in the inside direction of the wide pattern film, and thereby, a convex portion is provided for the second insulating pattern film on the edge of the wide pattern film, and the convex portion has a small width and a polishing rate for the convex portion is higher than that for the large-width concave and convex portions. So it can suppress the flattening film from having dishing and the like, and the surface flatness of the flattening film can be improved with not so high alignment accuracy. So by performing the above-mentioned patterning for the first insulating film in the region where the wide pattern film is arranged, a convex portion with a width smaller than that of the wide pattern film can be formed on the edge of the wide pattern film. As a result, the second insulating film formed on the first insulating pattern film has a convex portion with a smaller width compared with the case that the above-mentioned patterning is not performed for the first insulating film in the region where the wide pattern film is arranged. When the convex portion of the second insulating film is polished, the polishing rate for a wide convex portion with a small width is higher than that for a narrow convex portion, and so the convex portions of the second insulating film can be more quickly eliminated. As a result, the surface flatness of the flattening film, i.e., the polished insulating film, can be more improved.

It is preferable that the second insulating pattern film is polished by chemical mechanical polishing. According to CMP, the entire surface of an object tends to be uniformly polished. So if the object has a gently sloping curved surface, the resulting object still has a gently sloping curved surface. However, in this embodiment, the flattening film with extremely high flatness can be formed by CMP. Specifically, by flattening the first insulating pattern film, on which the second insulating film is formed; or by polishing the second insulating film formed on a deeply undulating surface defined by a convex portion of the first insulating pattern film, and by polishing the second insulating film formed thereon, not by forming the second insulating film on the patterned the first insulating pattern film and then polishing the second insulating film, thereby forming the flattening film with a gently sloping surface. For the flattening of the second insulating film and the like, etch-back, film formation, fluidization, selective growth, and the like, may be used. These flattening processes have difficulties in forming a flattening film at a uniform height from the cleavage layer to the flattening film surface. So CMP is preferably employed as the polishing of the present invention.

Hydrogen ion, inert gas ion such as rare gas ion may be used as the substance for cleavage. Helium ion is preferable as the rare gas ion. Hydrogen ion and rare gas ion each may be used singly or in combination. Ion implantation, ion doping, and the like, are mentioned as a way of implanting the ion. It is preferable that the substance for cleavage is at least one of hydrogen ion and inert gas ion. According to this, if the cleavage of the semiconductor chip from the cleavage layer is performed by heat treatment, the two can be easily cleaved because hydrogen and the like having been implanted rapidly expands by the heat treatment and then the cleavage layer bursts.

It is preferable that the semiconductor chip has a silicon oxide surface. According to this, the surface on the side where the conductive pattern is formed of the semiconductor substrate can be more tightly attached to the substrate surface onto which the semiconductor chip is transferred. The flattening film or an insulating film and the like formed thereon may constitute the semiconductor chip surface.

The present invention is also a production method of a semiconductor device including a semiconductor chip on a substrate with an insulating surface, the semiconductor chip having a conductive pattern film, the production method including the following successive steps:

a first insulating pattern film-forming step of forming a first insulating film on a semiconductor substrate and on a conductive pattern film formed on the semiconductor substrate and reducing a thickness of the first insulating film in a region where the conductive pattern film is arranged by patterning;

a flattening film-forming step of polishing the first insulating pattern film, thereby forming a flattening film;

a cleavage layer-forming step of implanting a substance for cleavage into the semiconductor substrate through the flattening film, thereby forming a cleavage layer;

an attachment step of attaching the flattening film of the semiconductor substrate to the substrate with an insulating surface, thereby completion of attachment between the two substrates; and a separation step of separating the semiconductor substrate from the cleavage layer. According to this production method, the shape of the formed first insulating pattern film before the polishing can be controlled. For example, the following embodiments can be provided: the first insulating pattern film is arranged in a region where the conductive pattern film is not arranged, and is not arranged on the conductive pattern; and the first insulating pattern film is arranged both in the region where the conductive pattern film is not arranged and on the conductive pattern film, and the first insulating pattern film on the conductive pattern film has a thickness smaller than that of the film in the region where the conductive pattern film is not arranged. By patterning the first insulating film before the polishing, the surface flatness of the flattening film can be improved compared with the case that the first insulating film is polished without being patterned. If the semiconductor chip includes a TFT, it is more preferable that a step of forming electrodes such as a source electrode and a drain electrode and a step of forming an insulating film on the electrodes and flattening the insulating film surface are performed after the cleavage layer-forming step and prior to the cleavage step.

It is preferable that the conductive pattern film has a width of 100 µm or larger. If the conductive pattern film has a large width, the first insulating film formed thereon might have an uneven thickness. If the conductive pattern film has a width of 100 µm or larger, a portion of the first insulating film on the conductive pattern film is subjected to the patterning, thereby more improving the flatness.

It is preferable that in the first insulating pattern film-forming step, the patterning is performed so that the first insulating pattern film in a vicinity of an edge of the conductive pattern film is provided with a convex portion projecting from a conductive pattern film side to a flattening film side. It is more preferable that by patterning the first insulating film in the region where the conductive pattern film is arranged, the first insulating film is provided with the convex portion so that the convex portion has an edge positioned 3 µm or smaller away from an edge of the conductive pattern film in the inside direction of the conductive pattern film, and specifically, the first insulating film in the region where the conductive pattern film is arranged is patterned so that the resulting portion has an edge positioned 3 µm or larger away from an edge of the conductive pattern film in the inside direction of the conductive pattern film. According to this, even if mispatterning of the first insulating film occurs, this is generated just in the region where the conductive pattern film is arranged, and the surface flatness of the flattening film is not so influenced.

The present invention is also a semiconductor device including a semiconductor chip on a substrate with an insulating surface, the semiconductor chip having a conductive pattern film, wherein the semiconductor chip includes a flattening film between the substrate and the conductive pattern film, and also includes a first insulating pattern film between the flattening film and the conductive pattern film, and the first insulating pattern film is arranged (at least) in a region where the conductive pattern film is not arranged (hereinafter, also referred to as a "first semiconductor device"). According to this, the region where the conductive pattern film is not arranged, where the flattening film possibly has dishing when polished, can be filled with the first insulating pattern film. As a result of formation of the first insulating film pattern, the surface flatness of the flattening film formed by polishing a second insulating film formed on the first insulating pattern film is improved, leading to an improvement in surface flatness of the semiconductor chip. Attributed to this improved surface flatness of the semiconductor chip, if, for example, the semiconductor chip includes a semiconductor portion on the side opposite to the acceptor substrate side, a distance from the bottom (the surface on the side opposite to the acceptor substrate side) of the semiconductor portion from the surface (the surface on the substrate side) of the flattening film can be uniform, which can provide a uniform thickness of the semiconductor portion. It is preferable that the semiconductor chip includes a TFT including a gate insulating film and a conductive pattern as a gate electrode arranged in this order on the acceptor substrate side of the semiconductor portion. Such a semiconductor portion functions as a functional layer of the TFT. In this case, the functional layer has a uniform thickness even if the semiconductor portion is etched for adjusting the thickness thereof. As a result, it is possible to suppress the functional layer of the semiconductor chip having been transferred onto the acceptor substrate from having an uneven thickness, and so the variation in electric properties of the TFTs can be suppressed. Further, the semiconductor portion is separated so that the distance from its bottom to the flattening film surface of the semiconductor chip is uniform, so a success probability of separation of the semiconductor substrate form the acceptor substrate can be increased, which can improve the production yield.

The configuration of the first semiconductor device is not especially limited as long as it essentially includes such components. The semiconductor device may or may not include other components. For example, if one semiconductor device includes a plurality of semiconductor chips, the semiconductor device may include metal wirings for connecting the chips to each other.

It is preferable that the first insulating pattern film is arranged in a region where the conductive pattern film is arranged, and the first insulating pattern film in the region where the conductive pattern film is arranged has a thickness smaller than a thickness of the first insulating pattern film in the region where the conductive pattern film is not arranged. According to this, in production of the semiconductor device, the height of a convex portion of the first insulating film, which is derived from the thickness of the conductive pattern film, can be decreased, and as a result, the flatness of the flattening film can be more improved. It is more preferable that the thickness of the first insulating pattern film in the region where the conductive pattern film is arranged accounts for 10% or smaller relative to that in the region where the conductive pattern film is not arranged. According to this, the flatness of the flattening film can be more improved.

It is preferable that a wide pattern film and a narrow pattern film are formed as the conductive pattern film, and the first insulating film in a vicinity of an edge of the wide pattern film has a convex portion projecting from a conductive pattern film side to a flattening film side. According to this, the convex portion in the vicinity of the edge has a width smaller than that of a convex portion of the first insulating film formed in a region where the wide pattern film is arranged, and so a second insulating film, which is formed on the first insulating film, also has a convex portion with a small width. So the flatness of the flattening film, which is the polished second insulating film, can be improved. The wide pattern film is a conductive pattern film with a width larger than that of the narrow pattern film. Preferably, the wide pattern film has a width of 100 µm or larger. Also it is preferable that the narrow pattern film has a width of smaller than 100 µm. It is more preferable that the first insulating film has the convex portion an edge of which is positioned 3 µm or smaller away from an edge of the wide pattern film in the inside direction of the wide pattern film. Specifically, it is preferable that the region where the convex portion overlaps with the wide pattern film has a width of 3 µm or smaller. As a result, the width of the convex portion is decreased, and the flatness of the flattening film is more improved.

It is preferable that the first insulating pattern film in the region where the conductive pattern film is not arranged is positioned 3 µm or smaller away from an edge of the conductive pattern film in an outside direction of the conductive pattern film. In this embodiment, the surface flatness of the flattening film can be improved, so the semiconductor chip has a more flat surface. As a result, if, for example, the semiconductor chip includes a TFT, uniformity of the distance from the functional layer to the flattening film can be more improved, and the cleavage layer, which is formed by implantation of a substance for cleavage, can be formed at a uniform depth. As a result, the transferred functional layer has a uniform thickness, leading to suppression of a variation in electric properties of the TFTs. Further, a success probability of the transfer can be increased because the functional layer has a uniform thickness.

The present invention is also a semiconductor device including a semiconductor chip on a substrate with an insulating surface, the semiconductor chip having a conductive pattern film, wherein the semiconductor chip includes a flattening film between the substrate and the conductive pattern film, the flattening film is arranged in a region where the conductive pattern film is arranged and in a region where the conductive pattern film is not arranged, and the flattening film in the region where the conductive pattern film is arranged has a thickness smaller than a thickness of the flattening film in the region where the conductive pattern film is not arranged (hereinafter, also referred to as a "second semiconductor device"). In this case, the semiconductor chip includes a first insulating pattern film and a flattening film. The first insulating pattern film is formed by patterning a first insulating film formed on a conductive pattern film, thereby removing the first insulating film in the region where the conductive pattern film is arranged. Further, the first insulating pattern film is polished to give the flattening film. As a result, the formed semiconductor portion has a uniform thickness, and so a variation in electric properties of the semiconductor chip can be suppressed. Further, the semiconductor chip preferably includes TFTs, and in such a case, a variation in electric properties of the TFTs can be suppressed because the functional layer of the TFT has a uniform thickness.

In the first and second semiconductor devices, it is preferable that the semiconductor chip includes a semiconductor portion on a conductive pattern film surface on a side opposite to the substrate side, the semiconductor portion being produced by being separated along a cleavage layer formed by implantation of a substance for cleavage through the flattening film. According to this, the cleavage layer is formed at a uniform distance from the flattening film surface, so the thickness of the semiconductor portion having been separated from the semiconductor substrate can be uniform. As a result, this semiconductor chip can show uniform electric properties.

The first and second semiconductor devices can be produced by the production method of the semiconductor device of the present invention. The thickness uniformity of the semiconductor portion of the semiconductor chip, which has been transferred onto the acceptor substrate from the semiconductor substrate, can be improved, and thereby the semiconductor chip can show uniform electric properties. Further, a success probability of the transfer can be improved, leading to an increase in production yield. It is preferable that the semiconductor chip includes TFTs, and in this case, a variation in electric properties of the TFTs can be suppressed because the thickness of the functional film of the TFT can be improved.

The present invention is a semiconductor device including a substrate and a semiconductor chip formed thereon, the semiconductor chip being produced by being transferred from a semiconductor substrate onto the substrate, wherein the semiconductor chip includes a semiconductor layer and a gate electrode, and the semiconductor layer has a channel region including single crystal silicon, and the gate electrode includes polysilicon (hereinafter, also referred to as a "third semiconductor device"). The semiconductor layer and gate electrode can be used as components of a TFT, for example. The channel region of the semiconductor layer in the third semiconductor device is positioned between regions (source and drain regions) with an impurity concentration higher than that of the channel region. By a voltage applied to the gate electrode, a current flowing between the source and drain regions through the channel region is controlled. It is preferable that a gate insulating film is arranged between the semiconductor layer and the gate electrode to control electrical conduction through the channel region by the voltage applied to the gate electrode. In this case, it is preferable that the channel region of the semiconductor layer and the gate electrode are arranged to overlap with each other with the gate insulating film therebetween. In the third semiconductor device, the semiconductor layer and the gate electrode are both made of silicon but different in its crystalline state. The semiconductor layer is made of single crystal silicon to permit more highly reliable transistor operation with more excellent characteristics than those of a semiconductor layer made of amorphous silicon or polysilicon.

The present invention is a semiconductor device comprising a semiconductor chip having a semiconductor layer and a gate electrode, on a substrate with an insulating surface, wherein the semiconductor layer has a channel region including single crystal silicon, and the gate electrode includes polysilicon (hereinafter, also referred to as a "fourth semiconductor device"). According to the fourth semiconductor device of the present invention, embodiments of the channel region of the semiconductor layer and the gate electrode, and preferable embodiments thereof are the same as in the third semiconductor device. According to the fourth semiconductor device, the semiconductor layer and the gate electrode are both made of silicon but different in its crystalline state. The semiconductor layer is made of single crystal silicon to permit more highly reliable transistor operation with more excellent characteristics than those of a semiconductor layer made of amorphous silicon or polysilicon.

In the third and fourth semiconductor devices, the semiconductor device includes a gate insulating film between the semiconductor layer and the gate electrode, and the gate insulating film includes a thermal oxide film. The thermal oxide film of the present invention is an oxide film formed by thermal oxidation. By thermal oxidation, an oxide film with insulating property can be easily obtained. In the third and fourth semiconductor devices, it is preferable that the thermal oxide film is a silicon thermal oxide film obtained by thermal oxidation of silicon.

EFFECT OF THE INVENTION

According to the production method of the semiconductor device of the present invention, the first insulating film is patterned to form the first insulating pattern film. This permits an improvement in surface flatness of the flattening film formed by polishing the first insulating pattern film or the second insulating film formed thereon.

BEST MODES FOR CARRYING OUT THE INVENTION

The present invention is mentioned in more detail with reference to drawings showing Embodiments but not limited thereto.

Embodiment 1

FIG. 1 is a cross-sectional view schematically showing a configuration of a semiconductor device arranged on a glass substrate 19 (a substrate with an insulating surface: acceptor substrate).

A semiconductor chip 100 of Embodiment 1 is arranged on the glass substrate 19, as shown in FIG. 1. The semiconductor chip 100 includes: a third insulating film 103; source and drain electrodes 106; a flattening film 18; a first insulating pattern film 16; an insulating thin film 13; a narrow gate electrode 14a with a line-width of 5 μm and a wide gate electrode 14b with a line-width of 100 μm; a gate insulating film 12 and a LOCOS oxide film 11; and a semiconductor portion 10a, in this order from the glass substrate 19 side. The first insulating pattern film 16 in a region where neither the narrow gate electrode 14a nor the wide gate electrode 14b are arranged has a thickness (d1) of 350 nm almost the same as the thickness of the gate electrode to be flattened. The first insulating pattern film 16 in a region where the narrow gate electrode 14a is arranged has a thickness (d2) of 40 nm or smaller. The edge of the first insulating pattern film 16 with 350 nm in thickness is positioned 3 μm away from the edge of the narrow gate electrode 14a in the outside direction of the electrode 14a. The first insulating pattern film 16 with 350 nm in thickness does not overlap with the narrow gate electrode 14a but overlaps with the wide gate electrode 14b. A side wall 17 is arranged on both sides of each of the narrow gate electrode 14a and the wide gate electrode 14b to enhance step coverage of a film to be formed on these conductive pattern films. On the narrow gate electrode 14a and the wide gate electrode 14b, the LOCOS oxide film 11 or the gate insulating film 12 is arranged, and thereon, the semiconductor portion 10a is arranged. The narrow gate electrode 14a and the wide gate electrode 14b each have a thickness of 350 nm. The semiconductor portion 10a has a portion the thickness of which has been decreased by formation of the LOCOS film 11, a portion where an interlayer insulating film is formed, or a portion to be connected to another (external) wiring. An insulating layer as a base coat film may be arranged on the glass substrate 19 surface.

Then, a production method of the semiconductor device of Embodiment 1 is mentioned with reference to FIGS. 1 and 2-1 to 2-7.

As shown in FIG. 2-1, a thermal oxide film is formed on a surface of the semiconductor substrate 10 made of single crystal silicon by rapid thermal oxidation and the like, and thereon, a silicon nitride ($SiN_x$) film is formed. Then, the $SiN_x$ film is patterned by photolithography and the like, and then, local oxidation of the single crystal silicon is performed using the patterned $SiN_x$ film as a mask to give the LOCOS oxide film 11. Successively, the $SiN_x$ film and the thermal oxide film are removed by etching, and then by thermal oxidation, the gate insulating film (thermal oxide film) 12 is formed in a region where the LOCOS oxide film is not arranged on the semiconductor substrate.

Then, a polysilicon film is formed by PECVD (plasma enhanced chemical vapor deposition), and then this p-Si film is patterned, thereby forming the narrow gate electrode 14a and the wide gate electrode 14b, which are to constitute a gate electrode and a gate wiring. The narrow gate electrode 14a and the wide gate electrode 14b each have a thickness of 350 nm.

Then, impurities at an LDD concentration are implanted into a region where an LDD layer (lightly doped drain) is to be formed of the semiconductor substrate 10. Thus, the LDD region is formed. Then, regions which are to constitute a carrier layer of the semiconductor substrate 10 are doped with impurities to give source and drain regions. In this case, the region where the narrow gate electrode 14a and the wide gate electrode 14b are arranged is not doped with the impurities, and this region constitutes a channel region of the semiconductor layer. Then, a silicon oxide film is formed by PECVD using TEOS as a raw material, and the formed film is anisotropically etched to form the side wall 17 on both side surfaces of the conductive pattern films.

Then, an oxide film ($SiO_2$) with 50 nm in thickness is formed as the insulating thin film 13 by PECVD using $SiH_4$ gas and $N_2O$ gas as raw materials. Then, a silicon oxide ($SiO_2$) film with 2000 nm is formed as the first insulating film 101 by PECVD using TEOS (tetraethoxy silane) as a raw material. As a result, the structure shown in FIG. 2-1 is completed. Then, as shown in FIG. 2-2, a resist material is formed on the first insulating film 101 and then patterned to give a resist 104. The resist 104 is formed in the region where the wide gate electrode 14b is arranged, and also formed in the region where the narrow gate electrode 14a is not arranged but formed with a space of 3 μm or smaller from the edge of the narrow gate electrode 14a. Then, the first insulating film 101 is patterned by dry etching. Successively, the patterned first insulating film 101 surface is polished by CMP to give the first insulating pattern film 16 as shown in FIG. 2-3. The second insulating film 102 is formed to have a thickness of 1000 to 5000 nm on the first insulating pattern film 16. In this case, the second insulating film 102 in the region where the wide gate electrode 14b is arranged has a convex portion projecting toward the side opposite to the semiconductor substrate 10 side, as shown in FIG. 2-4. Referring to FIG. 2-5, a portion of the second insulating film 102 in the region where the wide gate electrode 14b is arranged is removed so that the resulting portion has an edge positioned 2 μm or larger away from the edge of the wide gate electrode 14 in the inside direction of the electrode 14 but the second insulating film 102 in this resulting portion remains to have a thickness of 40 nm or smaller for passivation of the electrode 14b in this portion. Even if the second insulating film 102 in this portion is completely removed, the effects of the present invention can be obtained. Then, as shown in FIG. 2-6, the patterned second insulating film 102a is polished to give the flattening film 18. Then, hydrogen ions are implanted into the substrate at $1\times10^{16}$ to $1\times10^{17}$ $cm^{-2}$ to form the cleavage layer 105. FIG. 3(a) is a plan view schematically showing an arrangement relationship among the first insulating film, the second insulating film, and the conductive pattern film when the second insulating pattern film 102a formed by patterning the second insulating film 102 has a thickness of 350 nm. FIG. 3(b) is a cross-sectional view taken along line A-B of FIG. 3(a). The shaded region in FIG. 3(a) is a region where the wide gate electrode 14b overlaps with the second insulating pattern film 102a with 350 nm in thickness.

As shown in FIG. 2-7, contact holes penetrating the insulating thin film 13, the first insulating pattern film 16, and the flattening film 18 are formed, and thereinto source and drain electrodes 106 are formed. The $SiO_2$ film is formed to have a thickness of 1000 to 5000 nm, and its surface is flattened by being chem-mech polished by 200 to 400 nm to give the third insulating film 103. Then, the semiconductor structure, which is an assembly of a TFT and others formed on the semiconductor substrate 10, is divided into a desired size by dicing, laser dicing, and the like. Dicing is employed in the present Embodiment, but not limited thereto. The semiconductor structure may be divided into other shapes in accordance with intended applications. The semiconductor structure may not be divided. The "semiconductor structure" used herein means a structure on the semiconductor substrate before being divided.

Then, organic substances on the third insulating film 103 surface and the glass substrate 19 surface are removed and successively the both surfaces are activated by SC1. Then the surface of the first insulating film 103 is attached to the surface of the glass substrate 19. Then a heat treatment is performed to separate a portion of the semiconductor substrate 10, positioned lower than the hydrogen-injecting region 105 (on the side opposite to the side of the conductive pattern films and the like). Thus, transfer of the semiconductor chip 100 onto the substrate 19 is completed, as shown in FIG. 1. Then, the semiconductor portion 10a is etched to expose the LOCOS oxide film 11 surface of the semiconductor chip 100, and then, a heat treatment is performed. Then, after forming an insulating film, contact holes are formed, and wiring metal films forming a circuit are formed and patterned, for example. In these procedures, the semiconductor device is produced.

Embodiment 2

A production method of the semiconductor device in accordance with Embodiment 2 is mentioned with reference to FIGS. 4-1 to 4-6. In the production method of the semiconductor device of Embodiment 2, the step of forming an LOCOS oxide film 21 and a gate insulating film 22 on a semiconductor substrate 20 is the same as in Embodiment 1.

As shown in FIG. 4-1, a doped polysilicon film (polysilicon film doped with impurities) is formed on the gate insulating film 22 by PECVD and then patterned, thereby forming a narrow gate electrode 24a, which is to constitute a gate wiring. The narrow gate electrode 24a has a thickness of 400 nm.

Then, the semiconductor substrate 20 is doped with impurities to form source and drain regions. An oxide film ($SiO_2$) with 80 nm in thickness as an insulating thin film 23 is formed by PECVD method using $SiH_4$ gas and $N_2O$ gas as raw materials. Then, a silicon oxide film ($SiO_2$ film) as a first insulating film 201 is formed to have a thickness of 2000 nm by PECVD using TEOS as a raw material, thereby forming the first insulating film 201.

As shown in FIG. 4-2, a resist material is formed on the first insulating film 201 and then patterned to give a resist 204. The resist 204 is formed in a region where the conductive pattern film is not arranged so that the resist 204 has an edge positioned 3 μm away from the edge of the narrow gate electrode 14a in the outside direction of the edge of the electrode 14a. The first insulating film 20a is patterned by dry etching to give a first insulating pattern film 26, as shown in FIG. 4-3. Referring to FIG. 4-4, a second insulating film 202 is formed on the first insulating pattern film 26. Then, the second insulating film 202 is polished to give a flattening film 28, and therethrough, hydrogen ions are implanted into the substrate at $1 \times 10^{16}$ to $1 \times 10^{17}$ cm$^{-2}$, thereby forming a cleavage layer 205. Similarly to Embodiment 1, contact holes are formed and thereinto source and drain electrodes 206 are formed. Then, a third insulating film 203 is formed on the flattening film 28 and its surface is flattened by CMP. Further, the semiconductor structure is divided and the surfaces of the third insulating film 203 and the glass substrate 29 are activated. The semiconductor substrate 20 is separated along the cleavage layer 205. As a result, a semiconductor chip 200 is transferred onto the glass substrate 29. Thus, a semiconductor device shown in FIG. 4-6 is completed.

Embodiment 3

A production method of a semiconductor device in Embodiment 3 is mentioned with reference to FIGS. 5-1 to 5-5. According to the production method in Embodiment 3, the procedure from start to the formation of a LOCOS oxide film 31 is the same as in Embodiment 1.

After the LOCOS oxide film 31 is formed, a doped polysilicon (p-Si) film is formed on the film 31 and then patterned to give a wide gate electrode 34 for forming a capacitance. The wide gate electrode 34b has a thickness of 350 nm and a width of 250 μm.

Then, an oxide film ($SiO_2$) with 100 nm in thickness is formed as an insulating thin film 23 by PECVD using $SiH_4$ gas and $N_2O$ gas as raw materials. Further, a silicon oxide ($SiO_2$) film with 2000 nm in thickness is formed as a first insulating film 301 by PECVD using TEOS as a raw material, as shown in FIG. 5-1.

Then, referring to FIG. 5-2, a resist material is formed on the first insulating film 301 and then patterned to give a resist 304. The resist 304 is formed in a region where the wide gate electrode 34b is not arranged, and also formed in a region where the wide gate electrode 34b is arranged so that the resist has an edge positioned 2 μm away from the wide gate electrode 34b in the inside direction of the electrode 34b. Then, the first insulating film 301 is etched to give a first insulating pattern film 36. Thus, a structure shown in FIG. 5-3 is completed. The patterned first insulating pattern film 36 surface is polished by CMP to give a flattening film 38 shown in FIG. 5-4. Therethrough, hydrogen ions are implanted into the substrate at $1 \times 10^{16}$ to $1 \times 10^{17}$ cm$^{-2}$ to form a cleavage layer 305. Then, a third insulating film 303 is formed on the flattening film 38. The third insulating film 303 surface is flattened by CMP, and then the semiconductor structure is divided. The surfaces of the third insulating film 303 and the glass substrate 39 are activated, and then a semiconductor chip 300 is transferred onto the glass substrate 39. Thus, the semiconductor device shown in FIG. 5-5 is completed. The semiconductor structure may be divided into other shapes in accordance with intended applications. The semiconductor structure may not be divided.

Embodiment 4

A semiconductor device of Embodiment 4 has the same configuration as in Embodiment 2, except that the first insulating pattern film is not arranged in the region where the conductive pattern film is arranged. As shown in FIG. 6, an LOCOS oxide film 41, a gate insulating film 42, an insulating thin film 43, a gate electrode pattern film 44a, a first insulating pattern film 46, and a flattening film 48 are formed on a semiconductor substrate 40. Then, hydrogen ions are implanted into the substrate at $1 \times 10^{16}$ to $1 \times 10^{17}$ cm$^{-2}$ to form a cleavage layer 405. Further, contact holes penetrating the insulating thin film, the first insulating pattern film, and the flattening film; source and drain electrodes; and a third insulating film are formed. Then, the third insulating film is attached to another substrate, and the substrate 40 is separated along the cleavage layer 405. Thus, the semiconductor device is produced.

Embodiment 5

FIG. 7 is a cross-sectional view schematically showing a configuration of a semiconductor device arranged on a glass substrate 59 (substrate with an insulating surface, an acceptor substrate).

A semiconductor chip 500 of Embodiment 5 is arranged on the glass substrate 59 as shown in FIG. 7. The semiconductor chip 500 includes a third insulating film 503; a wiring metal 506, a flattening film 58; a first insulating pattern film 56; an insulating thin film 53; a narrow gate electrode with a line-width of 5 μm and a wide gate electrode 54b with a line-width of 100 μm; a gate insulating film 52 and a LOCOS oxide film 51; and a semiconductor portion 50a in this order from the glass substrate 59 side. The first insulating pattern film 56 in a region where neither the narrow gate electrode 54a nor the wide gate electrode 54b are arranged is formed to have a thickness of 350 nm almost equivalent to that of the narrow gate electrode 54a and the wide gate electrode 54b to be flattened. The first insulating pattern film 56 in the region where the narrow gate electrode 54a is arranged has a thickness of 40 nm or smaller. The first insulating pattern film 56 with 350 nm in thickness does not overlap with the narrow gate electrode 54a and has an edge positioned 3 μm away from the edge of the narrow gate electrode 54a in the outside direction of the electrode 54a. The first insulating pattern film 56 overlaps with the wide gate electrode 54b. The overlapping portion that has a thickness of 350 nm has an edge positioned 2 μm or smaller away from the edge of the wide gate electrode 54b in the inside direction of the electrode 54b. The overlapping portion with 350 nm in thickness has a convex portion projecting toward the side opposite to the semiconductor portion 50a side. The overlapping portion that has a thickness of 40 nm or smaller has an edge positioned 2

μm or larger away from the edge of the wide gate electrode 54b in the inside direction of the electrode 54b. A side wall 57 is formed on both side surfaces of each of the narrow gate electrode 54a and the wide gate electrode 54b to enhance step coverage of a film to be formed on these conductive pattern films. In the present Embodiment, the side wall may not be necessarily formed. The LOCOS oxide film 51 or the gate insulating film 52 is arranged on the narrow gate electrode 54a and the wide gate electrode 54b, and thereon, the semiconductor portion 50a is arranged. The narrow gate electrode 54a and the wide gate electrode 54b each have a thickness of 350 nm.

A production method of the semiconductor device of Embodiment 5 is mentioned with reference to FIGS. 7 and 8-1 to 8-6.

First, in the same manner as in Embodiment 1, the LOCOS oxide film 51 and the gate insulating film 52 are formed on the semiconductor substrate 50; the narrow gate electrode 54a and the wide gate electrode 54b, which are the conductive pattern films, are formed; and then, the insulating thin film 53 and the first insulating film 501 are successively formed on the semiconductor substrate 50. Then, a resist material is formed over the entire first insulating film 501 and then patterned. As shown in FIG. 8-2, the resist film in a region where the narrow gate electrode 54a and the wide gate electrode 54b are arranged is removed. The resulting resist 504 is formed is formed so that the resist 504 has an edge positioned 3 μm or larger away from the edge of the narrow gate electrode 54a in the outside direction of the electrode 54a. Further, the resulting resist 504 is formed to overlap with the wide gate electrode 54b so that the overlapping portion has an edge positioned 2 μm or smaller away from the edge of the wide gate electrode 54b in the inside direction of the electrode 54b. The resist 504 is not formed in the region where the gate electrode 54b is arranged except for this overlapping portion. Then, the first insulating film 501 is patterned by dry etching using the resist film as a mask. Successively, the first insulating film 501 surface is polished by CMP to give the first insulating pattern film 56 having a convex portion projecting toward the side opposite to the semiconductor substrate 50 side, as shown in FIG. 8-3. Referring to FIG. 8-4, a second insulating film 502 with 1000 to 5000 nm in thickness is formed on the first insulating pattern film 56. Then, the second insulating film 502 in the overlapping portion has a convex portion projecting toward the side opposite to the semiconductor substrate 50 side. Then, as shown in FIG. 8-5, the second insulating film 502 is polished to give a flattening film 58. Then, hydrogen ions are implanted into the substrate at $1 \times 10^{16}$ to $1 \times 10^{17}$ cm$^{-2}$ to form a cleavage layer 505.

As shown in FIG. 8-6, contact holes penetrating the insulating thin film 53, the first insulating pattern film 56, and the flattening film 58, and source and drain electrodes 506 are formed. Then, the SiO$_2$ film is formed to have a thickness of 2000 nm, and its surface is flattened by being chem-mech polished by 1100 nm to give the third insulating film 503. Then, the semiconductor structure, which is an assembly of a TFT and others formed on the semiconductor substrate 50, is divided into a desired size by dicing, laser dicing, and the like. Dicing is employed in the present Embodiment, but not limited thereto. The semiconductor structure may be divided into other shapes in accordance with intended applications. The semiconductor structure may not be divided.

Then, organic substances on the third insulating film 503 surface and the glass substrate 59 surface of the semiconductor chip 500 are removed and successively the both surfaces are activated by SC1. Then the surface of the first insulating film 503 is attached to the surface of the glass substrate 59. Then a heat treatment is performed to separate a portion of the semiconductor substrate 50, positioned lower than the hydrogen-injecting region 505 (on the side opposite to the side of the conductive pattern films and the like) from the acceptor substrate. Thus, transfer of the semiconductor chip 500 onto the substrate 59 is completed. Then, the semiconductor portion 50a is etched to expose the LOCOS oxide film 51 surface of the semiconductor chip 500, and then, a heat treatment is performed. Then, after forming an insulating film, contact holes are formed, and wiring metal films forming a circuit are formed and patterned, for example. In these procedures, the semiconductor device is produced.

Flattening Step by CMP

Flattening for the insulating film is mentioned with reference to FIGS. 9 to 12. FIG. 9 is a cross-sectional view schematically showing configurations before and after CMP for an insulating film formed on narrow gate electrodes each having a line-width of smaller than 100 μm. FIG. 10 is a cross-sectional view schematically showing configurations before and after CMP for a second insulating film formed on a patterned first insulating film formed on narrow gate electrodes each having a line-width of smaller than 100 μm. FIG. 11 is across-sectional view schematically showing configurations before and after CMP for an insulating film formed on wide gate electrodes each having a line-width of 100 μm or larger. FIG. 12 is a cross-sectional view schematically showing configurations before and after CMP for a first insulating pattern film obtained by patterning a first insulating film in a region where a wide gate electrode with a line-width of 100 μm or larger is arranged. In FIGS. 9 to 12, the solid lines 68, 78, 88, and 98 show the insulating film surfaces before the polishing, and the dotted lines 69, 79, 88, and 99 show the insulating film surfaces after the polishing.

In FIG. 9, the insulating film 67 formed on the narrow gate electrodes 64a is polished. Before the polishing, the insulating film 67 has a gently sloping surface due to the conductive pattern films formed therebelow. In this case, the chem-mech polished film 67 has big wave-like dishing derived from the surface shape defined by the conductive pattern films. As shown in FIG. 10, a second insulating film 77 is formed on a first insulating pattern film 76 formed by patterning a first insulating film. The second insulating film 77 has closely spaced convex portions derived from those of the first insulating pattern film 76. The polishing rate for such a region where the convex portions are closely spaced is high, and as a result, the polished second insulating film shows high flatness.

As shown in FIG. 11, an insulating film 87 formed on wide gate electrodes 84b is polished. Before the polishing, the insulating film 87 has a gently sloping surface due to the wide gate electrodes formed therebelow. In this case, the chem-mech polished insulating film 87 has a big wave-like dishing derived from the surface shape derived from the surface shape defined by the wide gate electrodes 84b. As shown in FIG. 12, a first insulating pattern film 96 is formed by removing the first insulating film in a region where the wide gate electrode 94b is arranged by patterning. The first insulating pattern film 96 has convex portions closely spaced. The polishing rate for such a region where the convex portions are closely spaced is high, and so the first insulating pattern film is more uniformly polished to show high flatness.

When CMP is employed, the polishing rate is high in order of a small convex portion, a large convex portion, a small concave portion, and a large concave portion. The reason of this is given below. If convex portions are widely spaced, a film formed thereon has concave and convex portions to have a gently-undulating surface, and so a difference in polishing rate between the concave and convex portions is small. In contrast, if the convex portions are closely spaced, a formed film has concave and convex portions to have a sharply-undulating surface, and so a polishing rate for the convex portion is higher than that for the concave portion. So the region where the conductive pattern film is not arranged, which is a large concave portion, is filled with the insulating film. Further, the large convex portion is patterned to become smaller, thereby more improving the flatness of the second insulating film formed on the insulating pattern film.

The present application claims priority to Patent Application No. 2007-326420 filed in Japan on Dec. 18, 2007 under the Paris Convention and provisions of national law in a designated State, the entire contents of which are hereby incorporated by reference.

BRIEF DESCRIPTION OF DRAWINGS

FIG. 2-1 is a cross-sectional view showing the semiconductor device in which the first insulating film has been formed in accordance with Embodiment 1.

FIG. 2-2 is a cross-sectional view showing the semiconductor device in which the resist has been formed in accordance with Embodiment 1.

FIG. 2-3 is a cross-sectional view showing the semiconductor device in which the first insulating pattern film has been formed in accordance with Embodiment 1.

FIG. 2-4 is a cross-sectional view showing the semiconductor device in which the second insulating film has been formed in accordance with Embodiment 1.

FIG. 2-5 is a cross-sectional view showing the semiconductor device in which the second insulating film has been patterned in accordance with Embodiment 1.

FIG. 2-6 is a cross-sectional view showing the semiconductor device in which the flattening film has been formed in accordance with Embodiment 1.

FIG. 2-7 is a cross-sectional view showing the semiconductor device in which the source and drain electrodes and the third insulating film have been formed.

FIG. 3 is a schematic view showing a configuration of the semiconductor device in which the second insulating film has been patterned in accordance with Embodiment 1. FIG. 3(a) is a schematic plan view thereof. FIG. 3(b) is a schematic cross-sectional view thereof.

FIG. 4-1 is a cross-sectional view showing the semiconductor device in which the first insulating film has been formed in accordance with Embodiment 2.

FIG. 4-2 is a cross-sectional view schematically showing the semiconductor device in which the resist has been formed in accordance with Embodiment 2.

FIG. 4-3 is a cross-sectional view schematically showing the semiconductor device in which the first insulating pattern film has been formed in Embodiment 2.

FIG. 4-4 is a cross-sectional view schematically showing the semiconductor device in which the second insulating film has been formed in accordance with Embodiment 2.

FIG. 4-5 is a cross-sectional view schematically showing the semiconductor device in which the flattening film has been formed in accordance with Embodiment 2.

FIG. 4-6 is a cross-sectional view schematically showing the semiconductor device in which the semiconductor chip has been separated in accordance with Embodiment 2.

FIG. 5-1 is a cross-sectional view showing the semiconductor device in which the first insulating film has been formed in accordance with Embodiment 3.

FIG. 5-2 is a cross-sectional view showing the semiconductor device in which the resist has been formed in accordance with Embodiment 3.

FIG. 5-3 is a cross-sectional view showing the semiconductor device in which the first insulating film has been patterned in accordance with Embodiment 3.

FIG. 5-4 is a cross-sectional view showing the semiconductor device in which the flattening film has been formed in accordance with Embodiment 3.

FIG. 5-5 is a cross-sectional view showing the semiconductor device in which the semiconductor chip has been separated in accordance with Embodiment 3.

FIG. 6 is a cross-sectional view showing the semiconductor device in which the flattening film has been formed in accordance with Embodiment 3.

FIG. 7 is a cross-sectional view schematically showing a configuration of the semiconductor device in accordance with Embodiment 5.

FIG. 8-1 is a cross-sectional view schematically showing the semiconductor device in which the first insulating film has been formed in accordance with Embodiment 5.

FIG. 8-2 is a cross-sectional view schematically showing the semiconductor device in which the resist has been formed in accordance with Embodiment 5.

FIG. 8-3 is a cross-sectional view schematically showing the semiconductor device in which the first insulating pattern film has been formed in accordance with Embodiment 5.

FIG. 8-4 is a cross-sectional view schematically showing the semiconductor device in which the second insulating film has been formed in accordance with Embodiment 5.

FIG. 8-5 is a cross-sectional view schematically showing the semiconductor device in which the flattening film has been formed in accordance with Embodiment 5.

FIG. 8-6 is a cross-sectional view schematically showing the semiconductor device in which the source and drain electrodes and the third insulating film have been formed in accordance with Embodiment 5.

FIG. 13-1 is a schematic cross-sectional view for explaining the step of forming the insulating film on the narrow and wide gate electrodes and then polishing the film by CMP, showing that the wide and narrow gate electrodes have been arranged on the semiconductor substrate.

FIG. 13-2 is a schematic cross-sectional view for explaining a step of forming an insulating film on the narrow and wide gate electrodes and polishing the film by CMP, showing that the insulating film has been formed.

FIG. 13-3 is a schematic cross-sectional view for explaining a step of forming an insulating film on the narrow and wide gate electrodes and polishing the film by CMP, showing a step of polishing the insulating film by a polishing pad.

FIG. 13-4 is a schematic cross-sectional view for explaining a step of forming an insulating film on the narrow and wide gate electrodes and polishing the film by CMP, showing a change in surface shape of the patterned insulating film.

FIG. 13-5 is a schematic cross-sectional view for explaining a step of forming an insulating film on the narrow and wide gate electrodes and polishing the film by CMP, showing that the cleavage layer has been formed.

Figure 1:
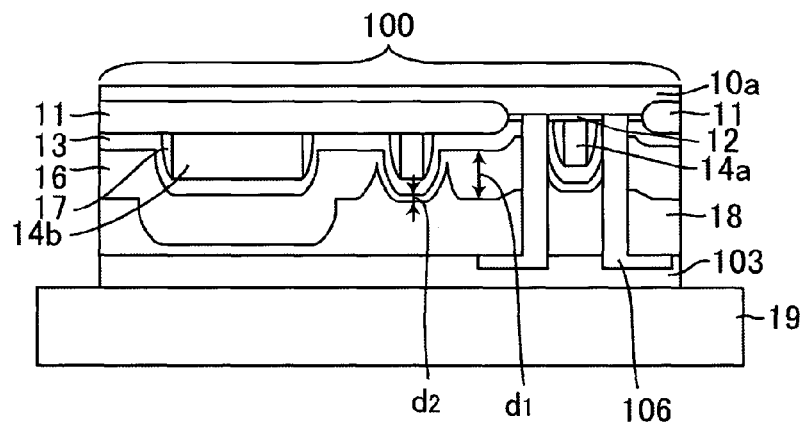
FIG. 1 is a cross-sectional view schematically showing a configuration of the semiconductor device in accordance with Embodiment 1.
Figures 1, 2:
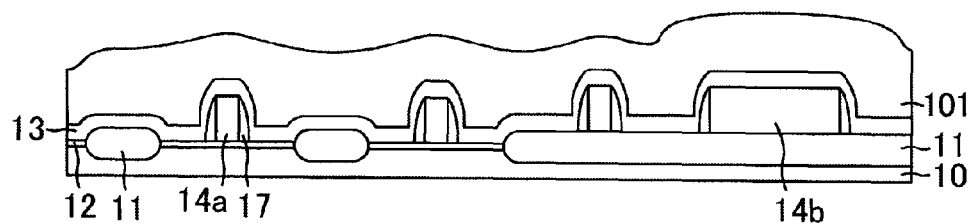
Figure 2:
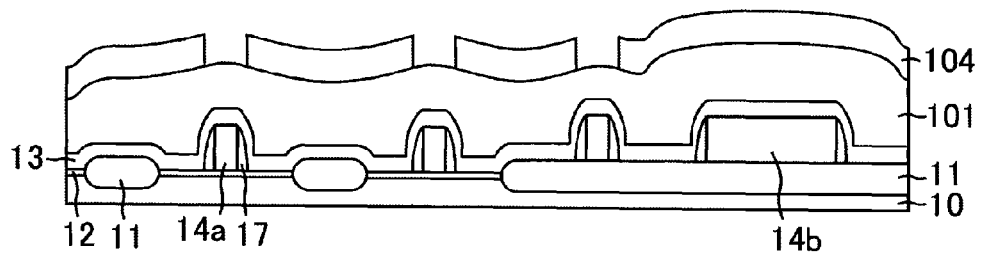
Figures 2, 3:
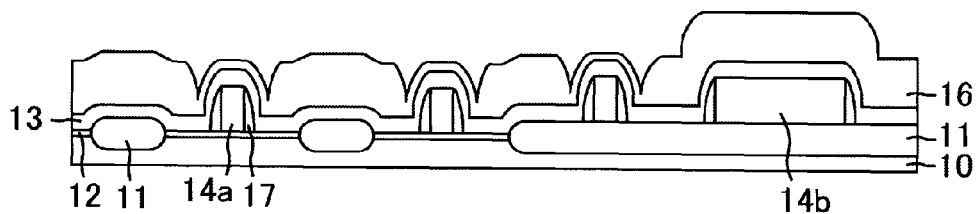
Figures 2, 3, 4:
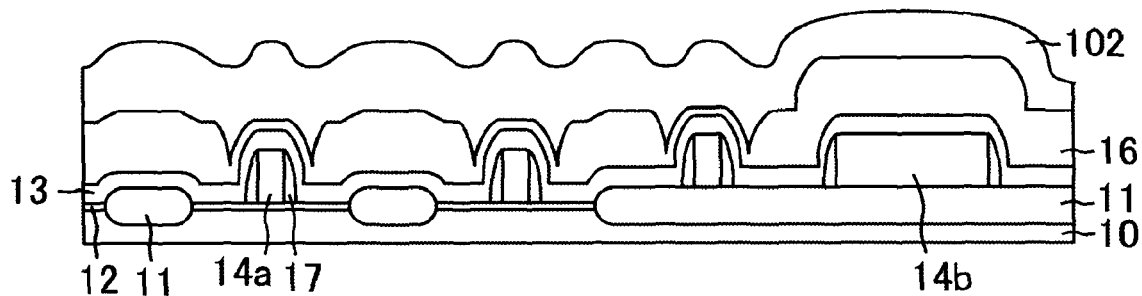
Figures 2, 3, 4, 5:
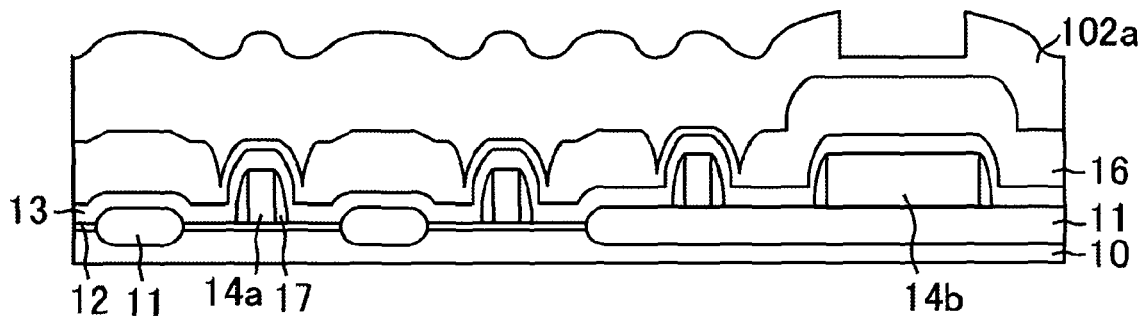
Figures 2, 3, 4, 5, 6:
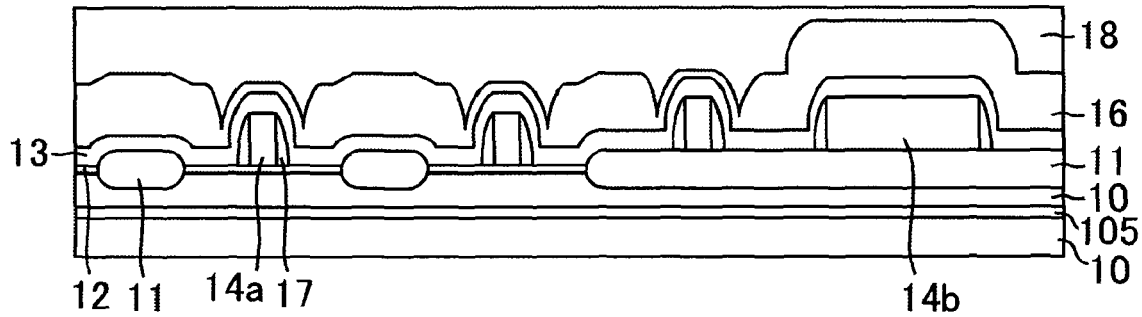
Figures 2, 3, 4, 5, 6, 7:
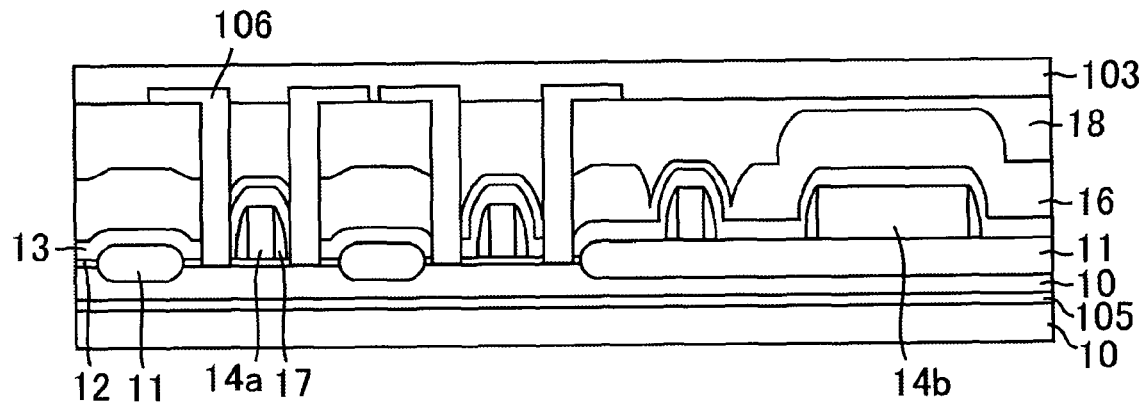
Figure 3:
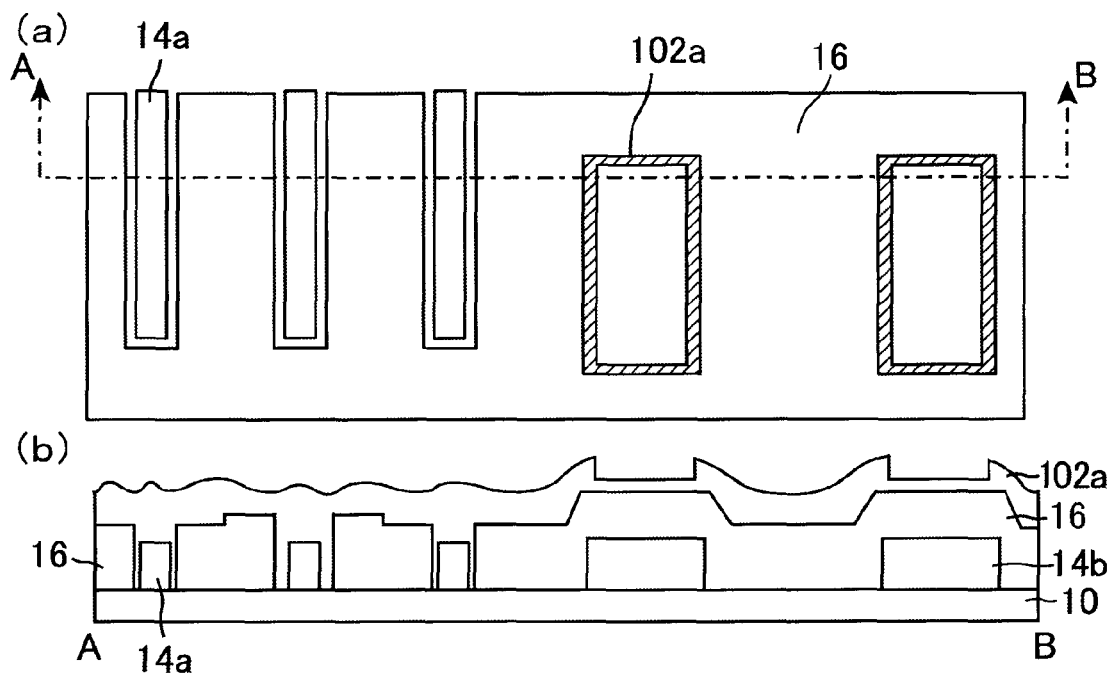
Figures 1, 4:
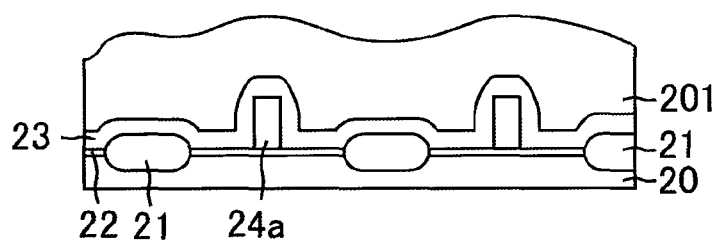
Figures 2, 4:
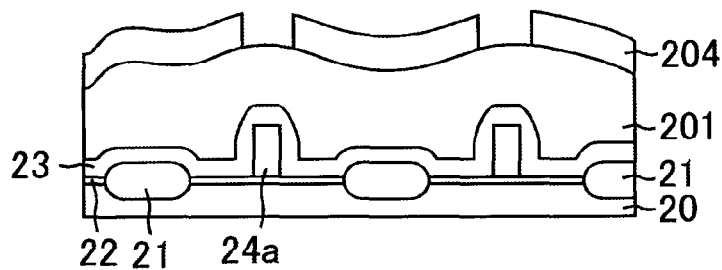
Figures 3, 4:
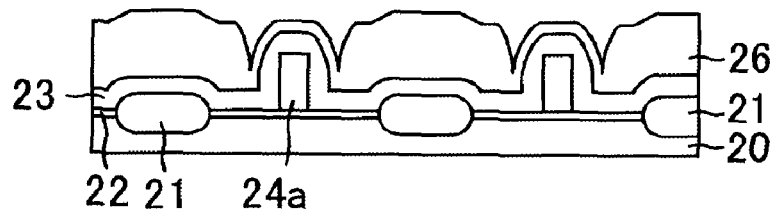
Figure 4:
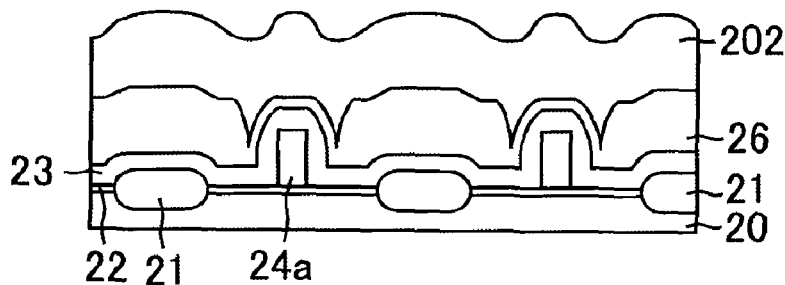
Figures 4, 5:
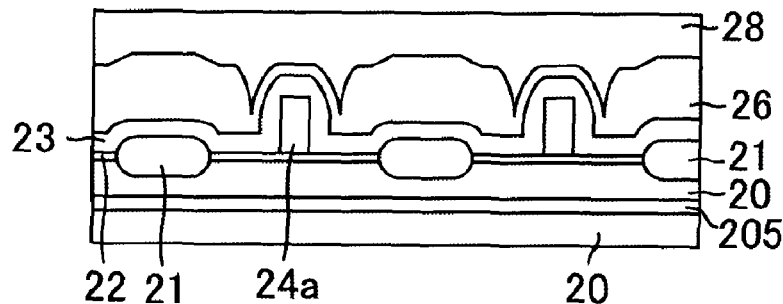
Figures 4, 5, 6:
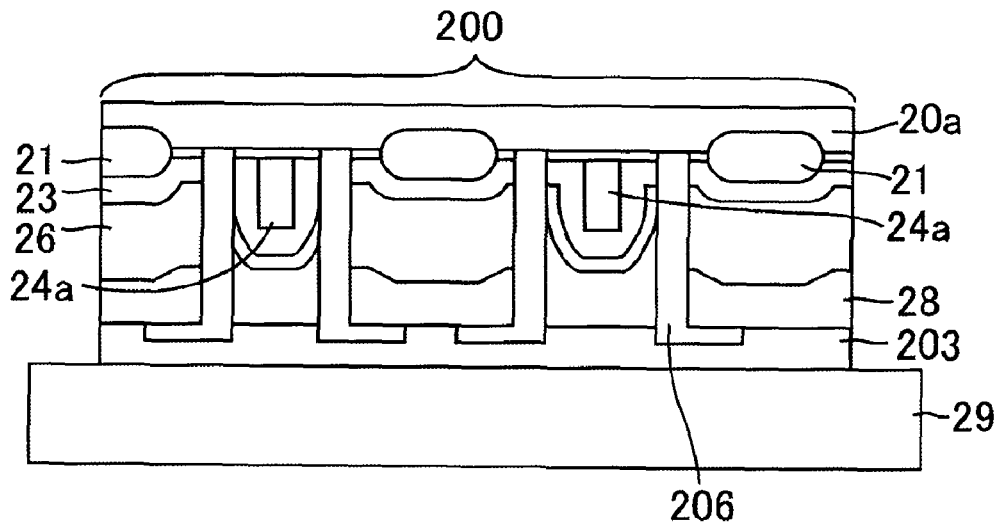
Figures 1, 5:
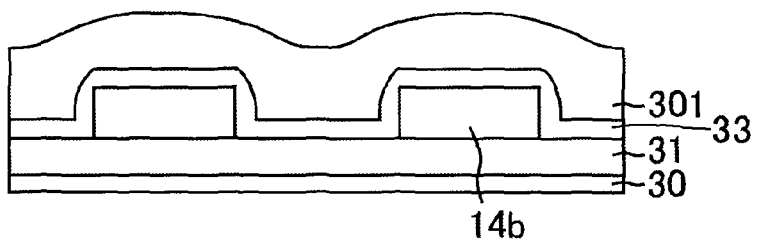
Figures 2, 5:
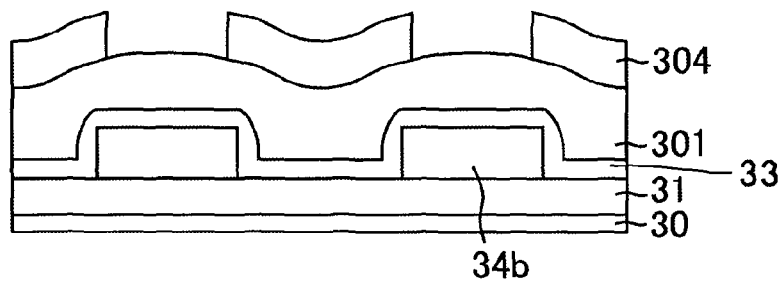
Figures 3, 5:
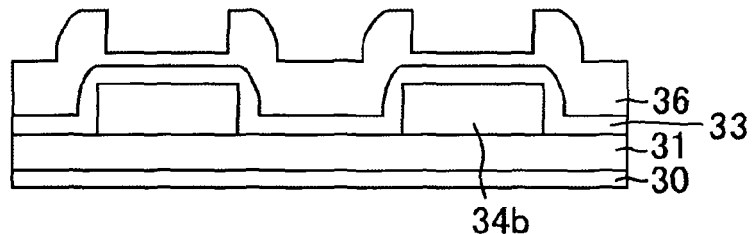
Figures 4, 5:
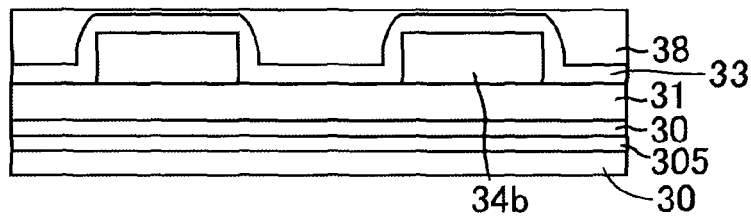
Figure 5:
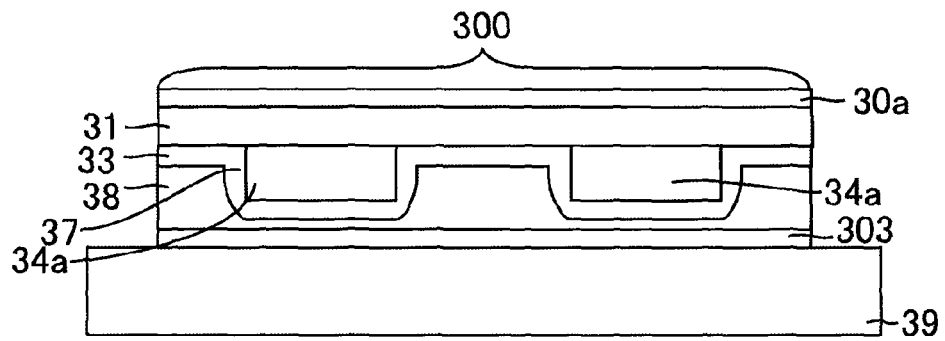
Figure 6:
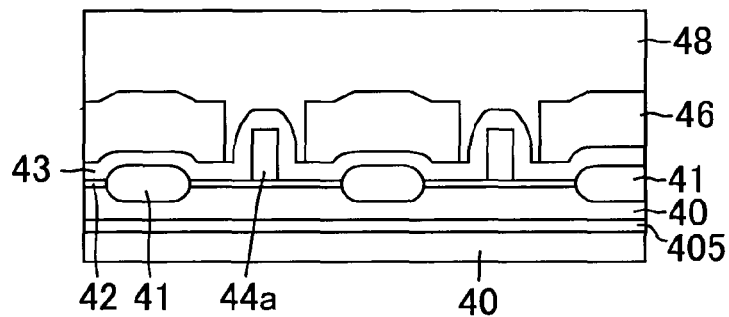
Figure 7:
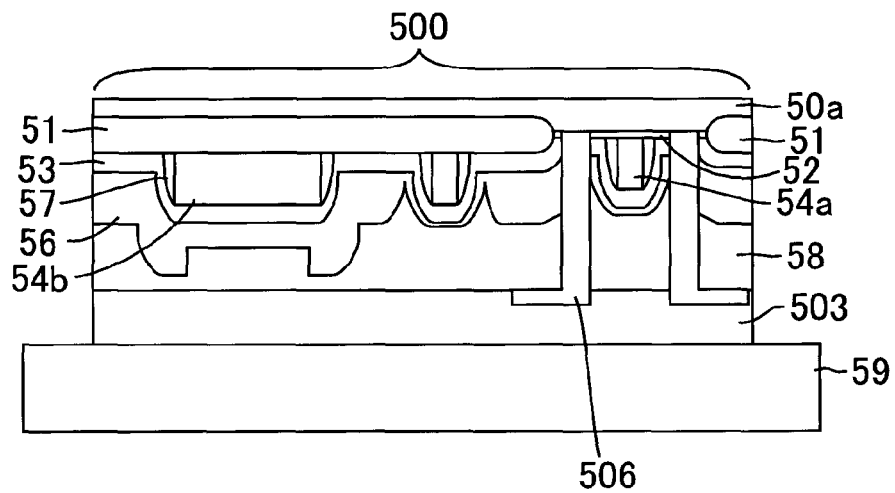
Figures 1, 8:
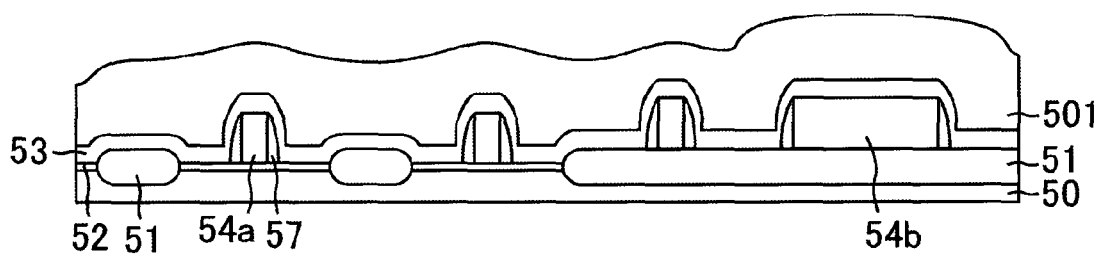
Figures 2, 8:
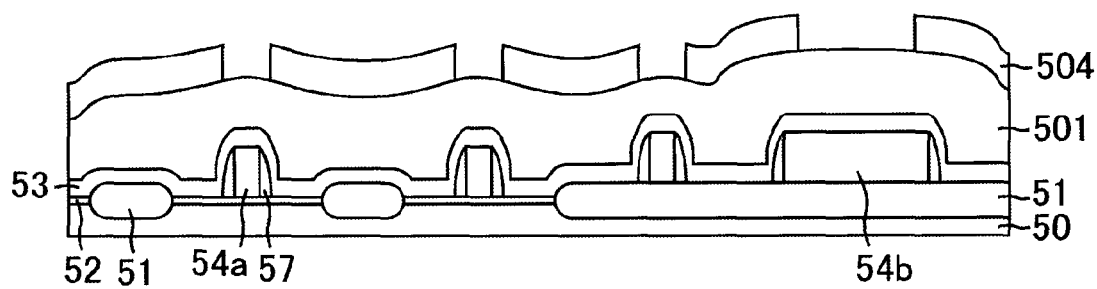
Figures 3, 8:
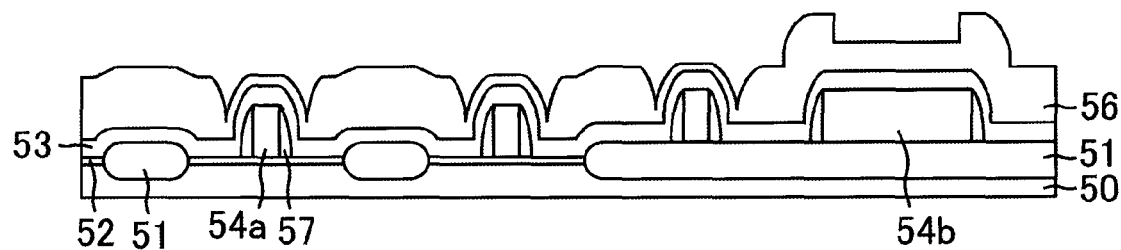
Figures 4, 8:
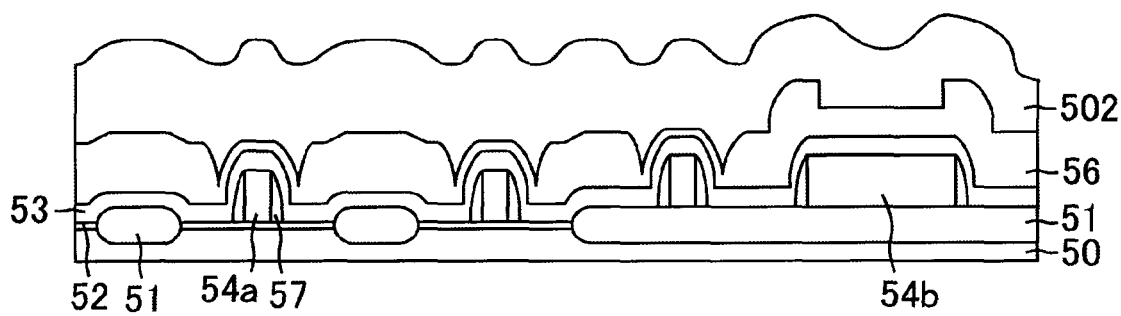
Figures 5, 8:
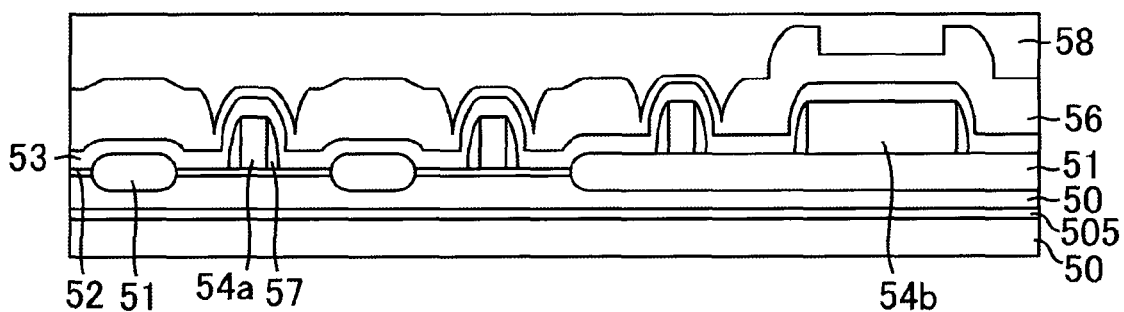
Figures 6, 8:
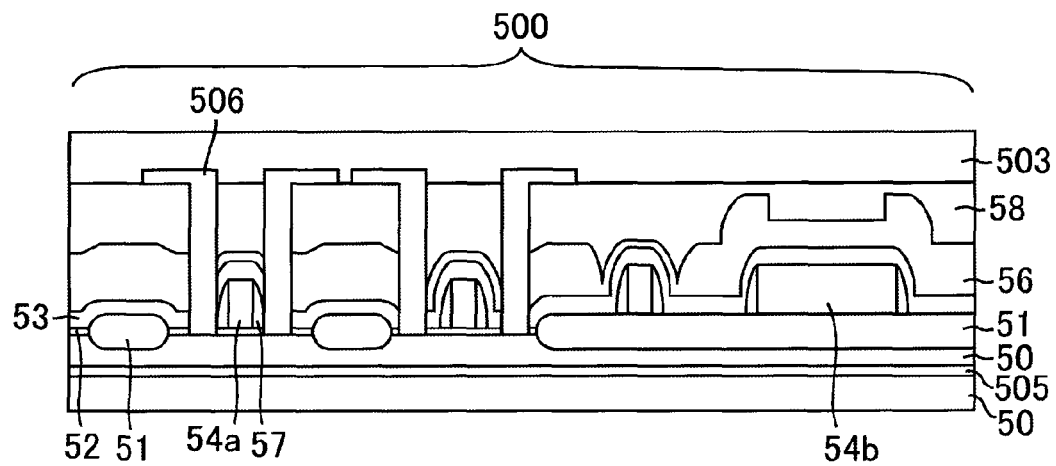
Figure 9:
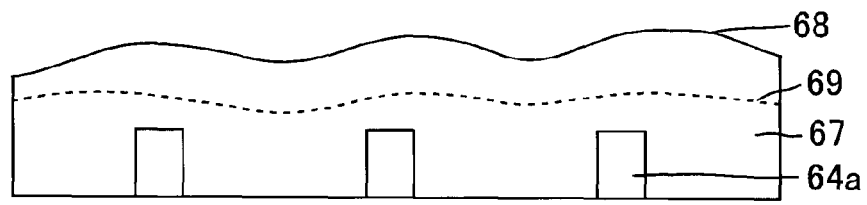
FIG. 9 is a cross-sectional view showing a step of polishing the insulating film formed on the narrow patterns.
Figure 10:
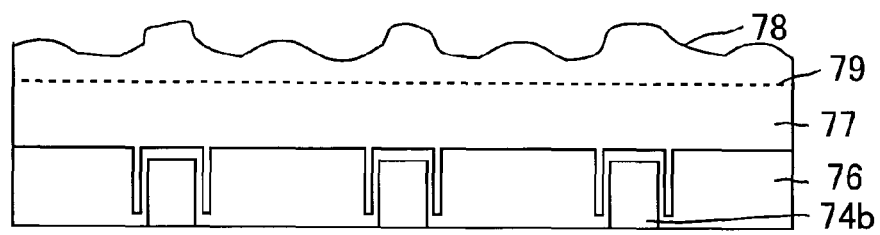
FIG. 10 is a cross-sectional view schematically showing a step of polishing the first insulating film formed on the patterned first insulating film formed on the narrow patterns.
Figure 11:
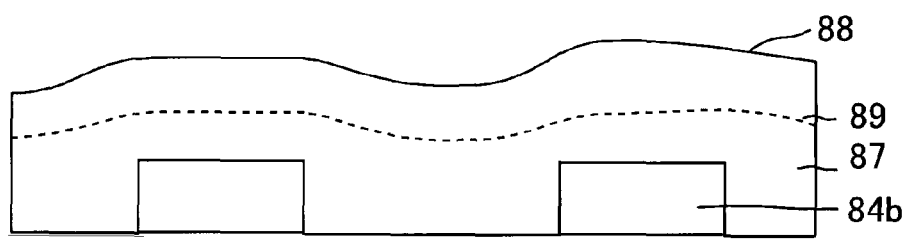
FIG. 11 is a cross-sectional view showing a step of polishing the insulating film formed on the wide patterns.
Figure 12:
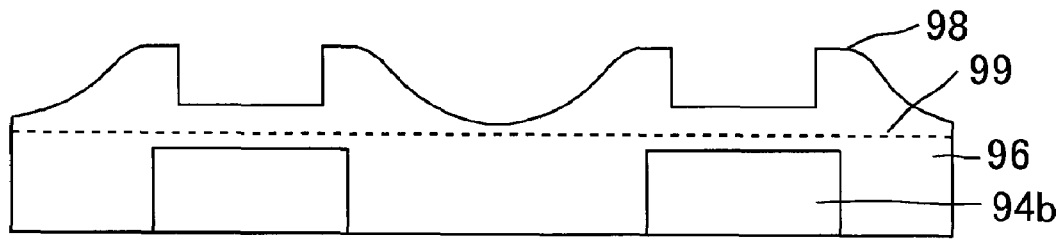
FIG. 12 is a cross-sectional view showing a step of polishing the second insulating film formed on the patterned first insulating film formed on the wide patterns.
Figures 1, 13:
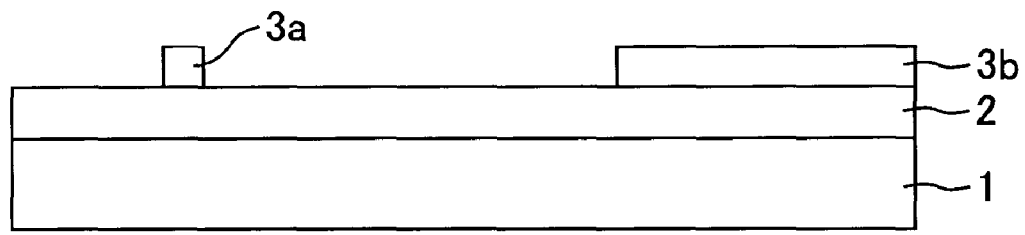
Figures 2, 13:
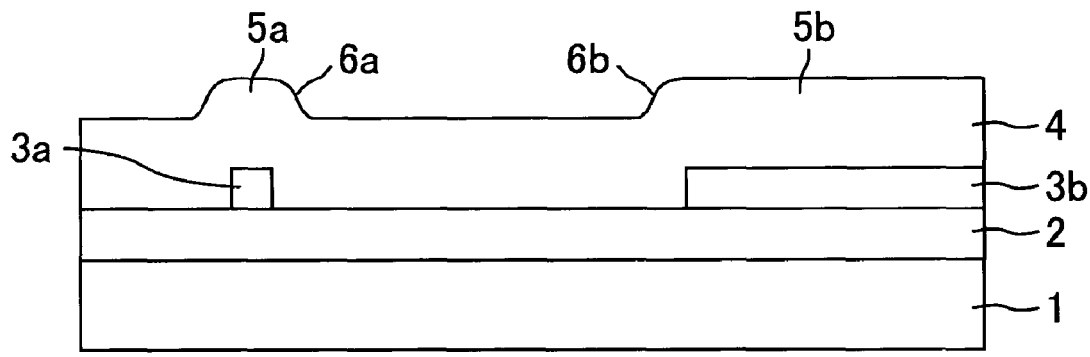
Figures 3, 13:
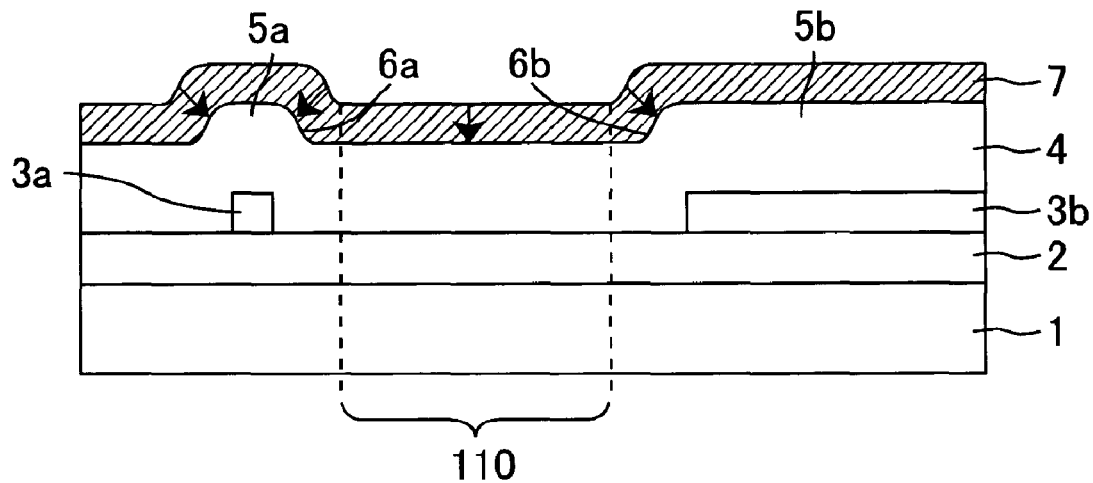
Figures 4, 13:
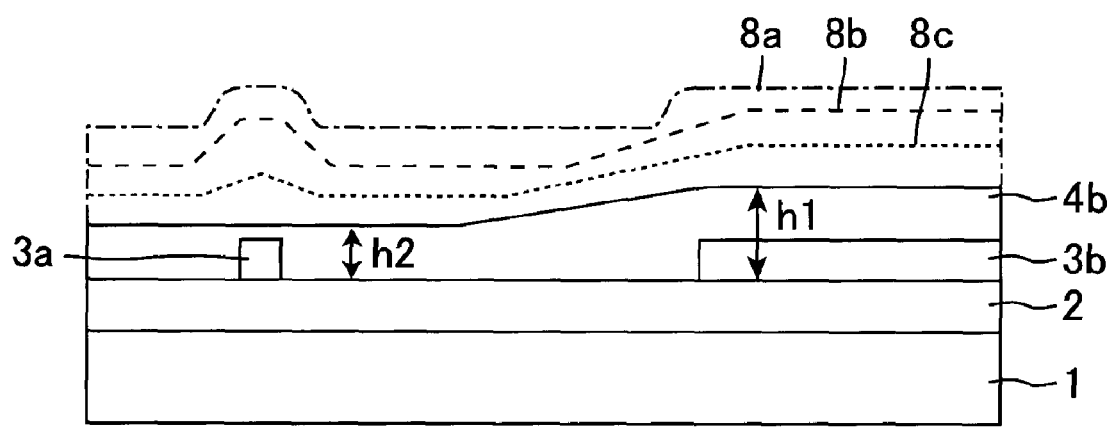
Figures 5, 13:
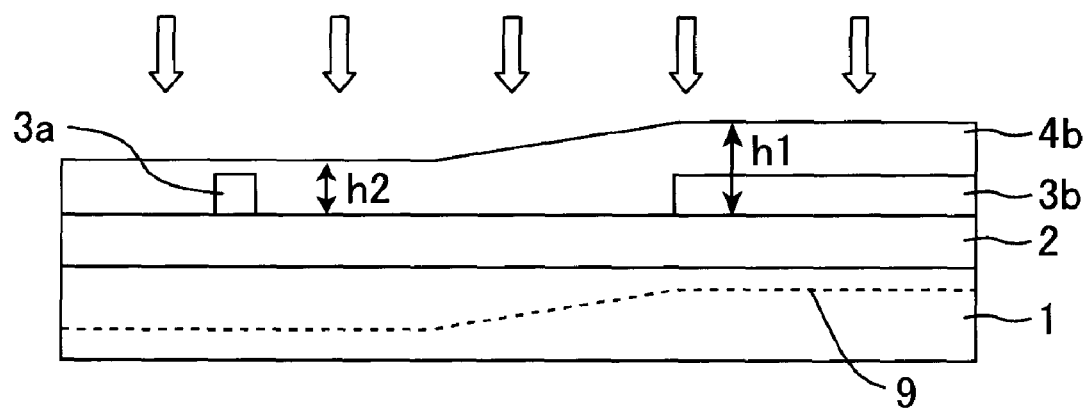

EXPLANATION OF NUMERALS AND SYMBOLS 1, 10, 20, 30, 40, and 50: Semiconductor substrate
2, 12, 22, 32, 42, 52: Gate insulating film
3a, 14a, 24a, 34a, 44a, 54a: Narrow gate electrode
3b, 14b, 34b, 64b, 74b: Wide gate electrode
4, 4b: Interlayer insulating film
5a: Convex portion on narrow gate electrode
5b: Convex portion on wide gate electrode
6a: Corner of convex portion on narrow gate electrode
6b: Corner of convex portion on wide gate electrode
7: Polishing pad
8a, 8b, 8c: Dotted line showing surface shape of patterned insulating film
9, 105, 205, 305, 505: Cleavage layer
10a, 20a, 30a, 50a: Semiconductor portion
11, 21, 31, 41, 51: LOCOS oxide film
13, 23, 33, 43, 53: Insulating thin film
16, 26, 36, 46, 56, 76, 96: First insulating pattern film
17, 57: Sidewall
18, 28, 38, 48, 58: Flattening film
19, 29, 39, 59: Glass substrate (substrate with an insulating surface, acceptor substrate)
67, 87: Insulating film
68, 78, 88, 98: Insulating film surface before polishing
69, 79, 89, 99: Insulating film surface after polishing
100, 200, 300, 500: Semiconductor chip
101, 201, 301, 501: First insulating film
77, 102, 202, 502: Second insulating film
102a: Second insulating pattern film
103, 203, 303, 503: Third insulating film
104, 204, 304, 504: Resist
106, 206, 506: Source and drain electrodes

The invention claimed is:

1. A production method of a semiconductor device including a semiconductor chip on a substrate with an insulating surface,
the semiconductor chip having a conductive pattern film,
the production method comprising the following successive steps:
a first insulating pattern film-forming step of forming a first insulating film on a semiconductor substrate and on a conductive pattern film formed on the semiconductor substrate and reducing a thickness of the first insulating film in a region where the conductive pattern film is arranged by patterning;
a flattening film-forming step of forming a second insulating film and polishing the second insulating film, thereby forming a flattening film;
a cleavage layer-forming step of implanting a substance for cleavage into the semiconductor substrate through the flattening film, thereby forming a cleavage layer;
an attachment step of attaching the flattening film of the semiconductor substrate to a substrate with an insulating surface, thereby completing the attachment step between the two substrates; and
a separation step of separating the semiconductor substrate from the cleavage layer.

2. The production method according to claim 1,
wherein in the first insulating pattern film-forming step,
the patterning is performed so that the first insulating pattern film in the region where the conductive pattern film is arranged has a thickness smaller than a thickness of the first insulating pattern film in a region where the conductive pattern film is not arranged.

3. The production method of claim 2,
wherein the patterning is performed so that the thickness of the first insulating pattern film in the region where the conductive pattern film is arranged accounts for 10% or smaller relative to that in the region where the conductive pattern film is not arranged.

4. The production method of claim 1,
wherein the patterning is performed so that the first insulating pattern film is formed only in the region where the conductive pattern film is not arranged.

5. The production method of claim 1,
wherein the patterning is performed so that the first insulating pattern film in the region where the conductive pattern film is not arranged is positioned 3 µm or smaller away from an edge of the conductive pattern film in an outside direction of the conductive pattern film.

6. The production method of claim 1,
wherein a wide pattern film and a narrow pattern film are arranged as the conductive pattern film, and
in the first insulating pattern film-forming step,
the patterning is performed so that a thickness of the first insulating film in a region where the wide pattern film is arranged is reduced.

7. The production method of claim 6,
wherein in the first insulating pattern film-forming step,
the patterning is performed so that the first insulating film in a vicinity of an edge of the wide pattern film is provided with a convex portion projecting from a conductive pattern film side to a flattening film side.

8. The production method of claim 1,
wherein the flattening film-forming step includes a second insulating pattern film-forming step of patterning the second insulating film prior to the polishing.

9. The production method of claim 8,
wherein a wide pattern film and a narrow pattern film are formed as the conductive pattern film, and
in the second insulating pattern film-forming step,
the patterning is performed so that a thickness of the second insulating film in a region where the wide pattern film is arranged is reduced.

10. The production method of claim 9,
wherein in the second insulating pattern film-forming step,
the patterning is performed so that the second insulating film in a vicinity of an edge of the wide pattern film is provided with a convex portion projecting from a conductive pattern film side to a flattening film side.

11. The production method of claim 1,
wherein the second insulating pattern film is polished by chemical mechanical polishing.

12. The production method of claim 1,
wherein the substance for cleavage is at least one of hydrogen ion and inert gas ion.

13. The production method of claim 1,
wherein the semiconductor chip has a silicon oxide surface.

14. A production method of a semiconductor device including a semiconductor chip on a substrate with an insulating surface,
the semiconductor chip having a conductive pattern film,
the production method comprising the following successive steps:
a first insulating pattern film-forming step of forming a first insulating film on a semiconductor substrate and on a conductive pattern film formed on the semiconductor substrate and reducing a thickness of the first insulating film in a region where the conductive pattern film is arranged by patterning;

a flattening film-forming step of polishing the first insulating pattern film, thereby forming a flattening film;

a cleavage layer-forming step of implanting a substance for cleavage into the semiconductor substrate through the flattening film, thereby forming a cleavage layer;

an attachment step of attaching the flattening film of the semiconductor substrate to the substrate with an insulating surface, thereby completing the attachment step between the two substrates; and a separation step of separating the semiconductor substrate from the cleavage layer.

15. The production method of claim 14, wherein the conductive pattern film has a width of 100 μm or larger.

16. The production method of claims 14, wherein in the first insulating pattern film-forming step, the patterning is performed so that the first insulating pattern film in a vicinity of an edge of the conductive pattern film is provided with a convex portion projecting from a conductive pattern film side to a flattening film side.

* * * * *